United States Patent
Besser et al.

(10) Patent No.: US 8,013,474 B2
(45) Date of Patent: ***Sep. 6, 2011

(54) SYSTEM AND APPARATUSES WITH MULTIPLE POWER EXTRACTORS COUPLED TO DIFFERENT POWER SOURCES

(75) Inventors: David A. Besser, Livermore, CA (US); Stefan Matan, Novato, CA (US)

(73) Assignee: XSLENT Energy Technologies, LLC, Novato, CA (US)

( * ) Notice: Subject to any disclaimer, the term of this patent is extended or adjusted under 35 U.S.C. 154(b) by 628 days.

This patent is subject to a terminal disclaimer.

(21) Appl. No.: 11/774,564

(22) Filed: Jul. 7, 2007

(65) Prior Publication Data

US 2008/0121272 A1      May 29, 2008

Related U.S. Application Data

(60) Provisional application No. 60/867,342, filed on Nov. 27, 2006, provisional application No. 60/888,486, filed on Feb. 6, 2007.

(51) Int. Cl.
*H01H 47/02*      (2006.01)
*H02N 6/00*       (2006.01)
*G01R 35/00*      (2006.01)
*G05F 1/00*       (2006.01)

(52) U.S. Cl. ............ 307/99; 307/24; 307/43; 307/109; 307/113; 307/126; 136/248; 324/601; 323/282; 323/234

(58) Field of Classification Search ............... 136/248; 307/24, 43, 99, 109, 113, 126; 324/601; 323/282, 234

See application file for complete search history.

(56) References Cited

U.S. PATENT DOCUMENTS

| | | | |
|---|---|---|---|
| 3,384,806 A | | 5/1968 | Hartman |
| 4,204,147 A | | 5/1980 | Larrabee |
| 4,375,662 A | | 3/1983 | Baker |
| 4,468,569 A | | 8/1984 | Norris |
| 4,580,090 A | | 4/1986 | Bailey et al. |
| 4,847,546 A | | 7/1989 | Bobier et al. |
| 4,873,480 A | | 10/1989 | Lafferty |
| 4,908,856 A | * | 3/1990 | Poletto ............... 379/413 |
| 5,027,051 A | | 6/1991 | Lafferty |
| 5,493,204 A | | 2/1996 | Caldwell |
| 5,604,430 A | | 2/1997 | Decker et al. |
| 5,623,398 A | * | 4/1997 | Beach et al. ............ 363/65 |

(Continued)

FOREIGN PATENT DOCUMENTS

EP      0591620      9/1999

(Continued)

OTHER PUBLICATIONS

International Search Report & Written Opinion mailed Jul. 31, 2008 for International Application No. PCT/US2008/001592.

(Continued)

*Primary Examiner* — Basia Ridley
*Assistant Examiner* — Tamir Ayad
(74) *Attorney, Agent, or Firm* — Blakely, Sokoloff, Taylor & Zafman, LLP

(57) ABSTRACT

In some embodiments, an apparatus or system may include multiple power extractors each coupled to a different power source. The power extractors may be in parallel or in series. The extractors and power supplies may be joined together in a frame. A power source and power extractor may be included in an integrated circuit. Other embodiments are described and claimed.

36 Claims, 21 Drawing Sheets

U.S. PATENT DOCUMENTS

| | | | |
|---|---|---|---|
| 5,659,465 | A | 8/1997 | Flack et al. |
| 5,682,305 | A | 10/1997 | Kurokami et al. |
| 5,684,385 | A * | 11/1997 | Guyonneau et al. ............ 307/46 |
| 5,801,519 | A | 9/1998 | Midya et al. |
| 5,869,956 | A | 2/1999 | Nagao et al. |
| 5,923,100 | A | 7/1999 | Lukens et al. |
| 6,031,736 | A | 2/2000 | Takehara et al. |
| 6,046,919 | A * | 4/2000 | Madenokouji et al. ......... 363/98 |
| 6,081,104 | A | 6/2000 | Kern |
| 6,100,665 | A | 8/2000 | Alderman |
| 6,100,675 | A | 8/2000 | Sudo |
| 6,294,900 | B1 | 9/2001 | Greenwood et al. |
| 6,433,522 | B1 | 8/2002 | Siri |
| 6,547,351 | B1 | 4/2003 | Wilson |
| 6,590,793 | B1 | 7/2003 | Nagao et al. |
| 6,657,419 | B2 * | 12/2003 | Renyolds ..................... 323/285 |
| 6,690,590 | B2 | 2/2004 | Stamenic et al. |
| 6,803,824 | B2 | 10/2004 | Rategh et al. |
| 6,963,147 | B2 | 11/2005 | Kurokami et al. |
| 6,966,184 | B2 * | 11/2005 | Toyomura et al. ........... 60/641.8 |
| 6,980,783 | B2 | 12/2005 | Liu et al. |
| 7,030,597 | B2 | 4/2006 | Bruno et al. |
| 7,045,991 | B2 | 5/2006 | Nakamura et al. |
| 7,068,065 | B1 | 6/2006 | Nasrullah |
| 7,091,707 | B2 | 8/2006 | Cutler |
| 7,158,395 | B2 | 1/2007 | Deng et al. |
| 7,239,628 | B1 | 7/2007 | Pendleton et al. |
| 7,256,566 | B2 | 8/2007 | Bhavaraju et al. |
| 7,324,361 | B2 | 1/2008 | Siri |
| 7,408,268 | B1 | 8/2008 | Nocentini et al. |
| 7,456,620 | B2 | 11/2008 | Maksimovic et al. |
| 7,479,774 | B2 | 1/2009 | Wai et al. |
| 7,529,107 | B2 | 5/2009 | Mehta |
| 7,570,501 | B2 | 8/2009 | Kawasaki et al. |
| 2004/0081473 | A1 * | 4/2004 | Sherazi et al. ................. 398/212 |
| 2004/0145357 | A1 | 7/2004 | Lynch et al. |
| 2005/0045223 | A1 * | 3/2005 | Jenson et al. ................. 136/248 |
| 2005/0047175 | A1 | 3/2005 | Kawasaki et al. |
| 2005/0052165 | A1 | 3/2005 | Willner et al. |
| 2005/0057214 | A1 | 3/2005 | Matan |
| 2005/0057215 | A1 | 3/2005 | Matan |
| 2005/0073783 | A1 | 4/2005 | Luo et al. |
| 2005/0076551 | A1 | 4/2005 | Silverstone et al. |
| 2005/0116671 | A1 | 6/2005 | Minami et al. |
| 2005/0172995 | A1 * | 8/2005 | Rohrig et al. ................. 136/243 |
| 2005/0219872 | A1 | 10/2005 | Lys |
| 2005/0231133 | A1 | 10/2005 | Lys |
| 2006/0001406 | A1 | 1/2006 | Matan |
| 2006/0087800 | A1 | 4/2006 | Savage |
| 2006/0164065 | A1 | 7/2006 | Hoouk et al. |
| 2006/0174939 | A1 | 8/2006 | Matan |
| 2006/0185727 | A1 | 8/2006 | Matan |
| 2007/0221267 | A1 | 9/2007 | Fornage |
| 2007/0235071 | A1 | 10/2007 | Work et al. |
| 2007/0273351 | A1 | 11/2007 | Matan |
| 2007/0290651 | A1 | 12/2007 | McNulty et al. |
| 2008/0036440 | A1 | 2/2008 | Garmer |
| 2008/0180075 | A1 | 7/2008 | Xie et al. |
| 2008/0198638 | A1 | 8/2008 | Reinberger et al. |
| 2008/0294916 | A1 | 11/2008 | Moussaoui |
| 2009/0085546 | A1 | 4/2009 | Phadke et al. |
| 2009/0108674 | A1 | 4/2009 | Ozaki et al. |
| 2009/0174262 | A1 | 7/2009 | Martin et al. |
| 2009/0189579 | A1 | 7/2009 | Melanson et al. |
| 2009/0196075 | A1 | 8/2009 | Arduini |
| 2009/0200985 | A1 | 8/2009 | Zane et al. |
| 2009/0244937 | A1 | 10/2009 | Liu |

FOREIGN PATENT DOCUMENTS

| | | |
|---|---|---|
| EP | 0941573 | 4/2002 |
| EP | 1239576 | 9/2002 |
| EP | 0947904 | 10/2003 |
| WO | WO-03007463 | 1/2003 |
| WO | WO-03056680 | 7/2003 |
| WO | WO-03105327 | 12/2003 |
| WO | WO-2004030194 | 4/2004 |
| WO | WO-2004045044 | 5/2004 |
| WO | WO-2005027300 | 3/2005 |
| WO | WO-2006075371 | 7/2006 |
| WO | WO-2006137948 | 12/2006 |

OTHER PUBLICATIONS

Non-Final Office Action mailed Jul. 2, 2009 for U.S. Appl. No. 11/774,562.
Non-Final Office Action mailed Jul. 7, 2009 for U.S. Appl. No. 11/774,563.
Non-Final Office Action mailed Sep. 4, 2009 for U.S. Appl. No. 11/774,566.
International Preliminary Report on Patentability (Chapter I) mailed Aug. 20, 2009 for International Appln. No. PCT/US2008/001592.
Non-Final Office Action mailed Oct. 21, 2009 for U.S. Appl. No. 11/849,242.
Non-Final Office Action mailed Oct. 10, 2009 for U.S. Appl. No. 11/774,565.
Final Office Action mailed Oct. 28, 2009 for U.S. Appl. No. 11/774,562.
Non-Final Office Action for U.S. Appl. No. 11/774,562, Mailed May 25, 2010, 14 pages.
Final Office Action for U.S. Appl. No. 11/774,563, mailed May 26, 2010, 16 pages.
Non-Final Office Action for U.S. Appl. No. 11/849,242, Mailed May 26, 2010, 15 pages.
Final Office Action for U.S. Appl. No. 11/774,565, Mailed May 26, 2010, 13 pages.
Final Office Action for U.S. Appl. No. 11/774,566, Mailed Apr. 21, 2010, 17 Pages.
Notice of Allowance from U.S. Appl. No. 11/774,562, mailed Sep. 29, 2010, 11 pages.
Office Action from U.S. Appl. No. 11/774,565, mailed Oct. 15, 2010, 13 pages.
Final Office Action from U.S. Appl. No. 11/849,242, mailed Oct. 25, 2010, 14 pages.
Office Action from U.S. Appl. No. 11/774,566, mailed Nov. 1, 2010 15 pages.
Examination Report with Notice of Grant Fees due from application No. 200905219-2, mailed Nov. 12, 2010, 3 pages.

* cited by examiner

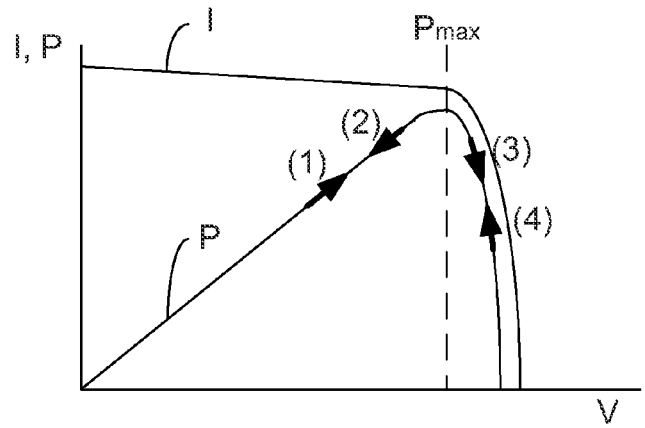
FIG. 9
| Example | Power | Voltage | Side of Pmax | Current | Change to Duty Cycle |
|---|---|---|---|---|---|
| (1) | Increasing | Increasing | Left | Too much | Decrease |
| (2) | Decreasing | Decreasing | Left | Too much | Decrease |
| (3) | Decreasing | Increasing | Right | Too little | Increase |
| (4) | Increasing | Decreasing | Right | Too little | Increase |
FIG. 10
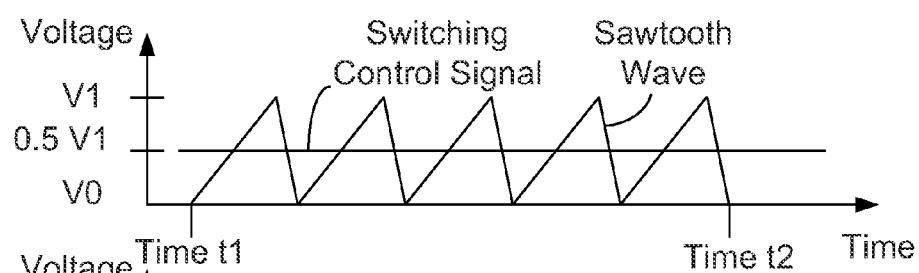
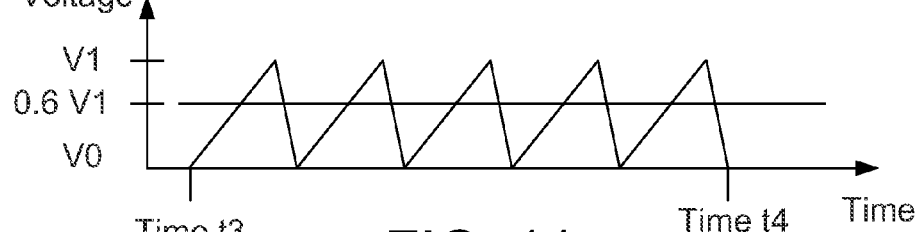
FIG. 11

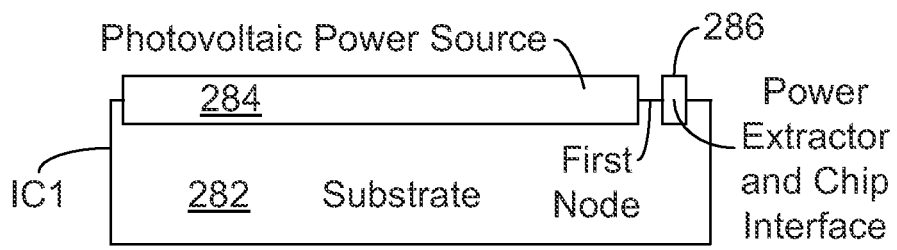
FIG. 32
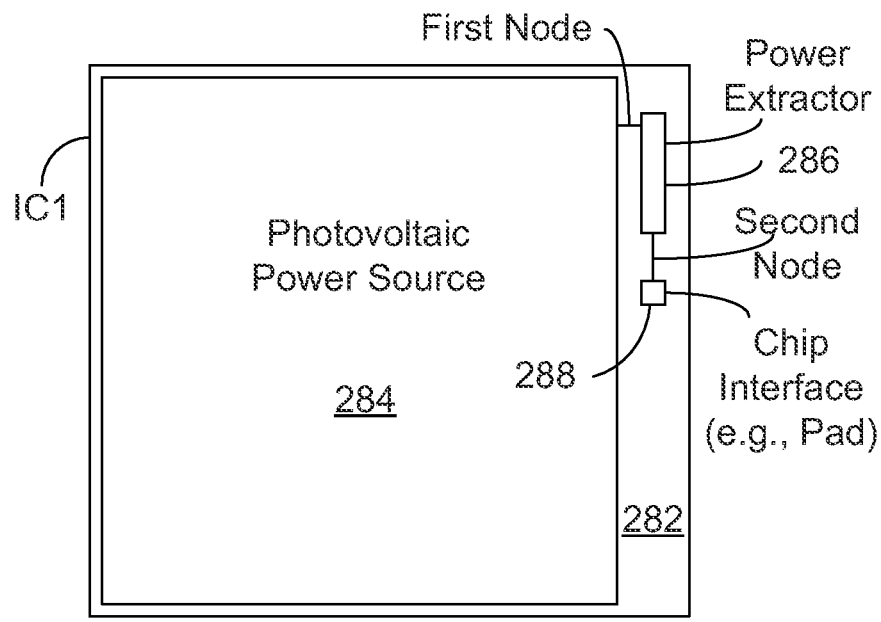
FIG. 33
FIG. 34

SYSTEM AND APPARATUSES WITH MULTIPLE POWER EXTRACTORS COUPLED TO DIFFERENT POWER SOURCES

The U.S. application claims priority to Provisional Application No. 60/867,342 entitled XSLENT Power Extractor (XPX) filed on Nov. 27, 2006 and to Provisional Application No. 60/888,486 entitled Power Extractor Convertier (XPX Converter) filed on Feb. 6, 2007.

RELATED APPLICATIONS

This application and other applications have identical figures and nearly identical descriptions. The other applications are hereby identified as U.S. patent application Ser. No. 11/774,562, filed Jul. 7, 2007, and entitled, "Power Extractor Detecting a Power Change"; U.S. patent application Ser. No. 11/774,563, entitled, "Power Extractor with Control Loop"; U.S. patent application Ser. No. 11/774,565, entitled, "Power Extractor for Impedance Matching"; and, U.S. patent application Ser. No. 11/774,566, entitled, "Power Extractor Detecting Power and Voltage Changes," all filed Jul. 7, 2007.

FIELD

Embodiments of the invention relate generally to electrical power and more particularly to apparatuses, methods and systems including a power extractor for DC-to-DC power transfer between a source and a load.

BACKGROUND

The commercial switched-mode power supply industry was beginning to grow during the 1970s, and the theory and technology of switched-mode conversion was being understood as part of the academic discipline of Power Electronics. The Power Electronics Group of the California Institute of Technology (Caltech) in California, USA developed the models for the three basic DC-to-DC switching regulator topologies already developed, namely the buck, boost and buck-boost converters. From this work stemmed the modeling and analysis method called state-space averaging which allowed the theoretical prediction of a converters frequency response, and therefore a better understanding of a switched-mode regulator's feedback loop and stability criteria. Further work at Caltech, especially by Slobodan Ćuk (1976) produced a fourth member of the basic DC-to-DC switching regulators which has been described as an optimum topology because of its symmetrical structure and non-pulsating input and output currents. This topology DC-to-DC switching regulator is now commonly known as the Ćuk converter.

The theorem known as the maximum power theorem (Jacobi's Law) states: "Maximum power is transferred when the internal resistance of the source equals the resistance of the load, when the external resistance can be varied, and the internal resistance is constant."

Solar power is a clean and renewable source of energy. Solar power, or solar energy, is the technology of obtaining usable energy from the light of the sun. A photovoltaic cell is a device for converting light energy into electricity. Photovoltaic cells are often used specifically to receive sunlight (and are called solar cells), but may respond to light from other sources. A solar cell array or module or panel is a group of solar cells electrically connected and packaged together. While the interest in solar power is high, the high cost of producing solar cells and arrays coupled with the traditionally low energy efficiency of these devices prevents widespread usage of solar power. Given the variations in sunlight (clouds, rain, sunrise, sunset, altitude, latitude, etc.), solar power is an example of an unstable energy source. Unstable power sources may include natural power sources, but may also include man-made power sources. As with solar energy, minimizing power loss is a significant challenge when attempting to extract and/or convert energy from unstable power sources to stable, useable forms of power. Other examples of power sources include, but are not limited to, wind, water, heat, tidal forces, heat (e.g., thermal couple), hydrogen power generation, gas power generation, radioactive, mechanical deformation, piezo-electric, and motion (e.g., human motion such as walking, running, etc.). Other power sources may be stable (providing an essentially constant power but variable in magnitude).

Prior techniques have been employed to improve the efficiency of solar cells. One of the earliest improvements was the addition of a battery to a solar cell circuit to load level the electrical output from the circuit during times of increased or decreased solar intensity. In itself, a photovoltaic or solar array can supply electrical power directly to an electrical load. However, a major drawback of such a configuration is the diurnal variance of the solar intensity. For instance, during daylight operation, a solar cell produces excess power while during nighttime or periods of reduced sunlight there is little or no power supplied from the solar cell. In the simplest electrical load leveling scenario, the battery is charged by the solar cell during periods of high solar radiation, e.g., daylight, and the energy stored in the battery is then used to supply electrical power during nighttime periods.

A single solar cell normally produces a voltage and current much less than the typical requirement of an electrical load. For instance, a typical conventional solar cell provides between 0.2 and 1.4 Volts of electrical potential and 0.1 to 5.0 Amperes of current, depending on the type of solar cell and the ambient conditions under which it is operating, e.g., direct sunlight cloudy/rainy conditions, etc. An electrical load typically requires anywhere between 5-48 Volts (V) and 0.1-20 Amperes (A). The industry's standard method of overcoming this mismatch of electrical source to load is to arrange a number of solar cells in series to provide the needed voltage requirement and arrange in parallel to provide the needed current requirement. These arrangements are susceptible if the output of individual cells within the solar cell array is not identical. These differences have a negative effect on the array's ability to efficiently convert solar energy into electrical energy. The array's output voltage or current will drop and the array may not function to specification. For example, a common practice it is to configure a solar cell array for an output voltage of 17 V to provide the necessary 12 V to a battery. The additional 5 V provides a safety margin for the variation in solar cell manufacturing and/or solar cell operation (e.g., reduced sunlight conditions, temperature variations within the array, or just dirty cells within the array).

Continuing with this scenario, assuming that the current produced by traditional solar cell arrays is constant, the solar cell array loses efficiency due to the panel array being 5 volts higher than the battery voltage. For example, a solar cell array rated for 75 Watts (W) at 17 Volts will have maximum current of 75 divided by 17, which equals 4.41 Amperes. During direct sunlight, the solar cell array may actually produce 17V and 4.41 A. However, given that the battery is rated at 12V, in this scenario, the power transferred will only be 12V at 4.41 A, which equals 52.94 W and results in a power loss of about 30%. This margin creates a significant power loss; and is typical of what is seen in actual installations where the cell array is connected directly to the batteries, however, it is not desirable to reduce the margin voltage provided by the solar cell array because under reduced sunlight conditions, the voltage potential produced by the solar cell array will drop due to low electron generation, and thus might not be able to charge the battery or will consume power from the battery that it was intended to charge.

FIG. 1 illustrates a prior art system for generating solar power. Photovoltaic (PV) cells 12, 14, and 16 are connected in series to a load 26 through protective circuitry 22 (such as a diode). In the example discussed above, a protection circuit that would prevent the reverse flow of power into the array (e.g., protective circuitry 22) could convert a 17V, 4.41 A input from a solar cell array (e.g., PV cells 12-16) to a 12V and 4.41 A output in order to charge a 12 V battery, which is a significant amount of power loss.

Recent developments in switching converter technology include a technique referred to as maximum power point tracking (MPPT), discussed in U.S. Pat. No. 6,844,739 to Kasai et al.

SUMMARY

In some embodiments, an apparatus includes a first node, a second node, a photovoltaic power source, and a power extractor. The power extractor is to transfer power from the photovoltaic power source between the first and second nodes, wherein the power extractor, the first node, the power source, and the second node are each part of a single integrated circuit.

In some embodiments, an apparatus includes a first node, a second node, a third node, a fourth node, and a first power extractor to transfer first power between the first and second nodes including providing a first current to the second node. The first power extractor includes first power change analysis circuitry to detect first power changes, and wherein the first power extractor transfers the first power at magnitudes that are at least partially dependent on the detected first power changes. The apparatus further includes a second power extractor to transfer second power between the third and fourth nodes including providing a second current to the fourth node, and wherein the second power extractor includes second power change analysis circuitry to detect second power changes, and wherein the second power extractor transfers the second power at magnitudes that are at least partially dependent on the detected second power changes.

In some embodiments, a system includes a node, a group of power sources arranged in a frame; and a group of power extractors to each provide electrical power from only one of the power sources to the node.

Other embodiments are described and claimed.

BRIEF DESCRIPTION OF THE DRAWINGS

The following description includes discussion of various figures having illustrations given by way of example of implementations of various embodiments of the inventions. The drawings should be understood by way of example, and not by way of limitation.

FIG. 9 illustrates power change examples in connection with a current-voltage (IV) curve and a power curve.

FIG. 10 is a table illustrating operational concepts for a power extractor according to various embodiments.

FIG. 11 illustrates two examples of a saw tooth wave and a switching control signal according to some embodiments.

FIG. 32 illustrates a side view of a integrated circuit including a photovoltaic power source and a power extractor according to some embodiments.

FIG. 33 illustrates a top view of the integrated circuit of FIG. 32.

FIG. 34 illustrates a group of the integrated circuits of FIG. 32 in an array.

DETAILED DESCRIPTION

Figure 1:
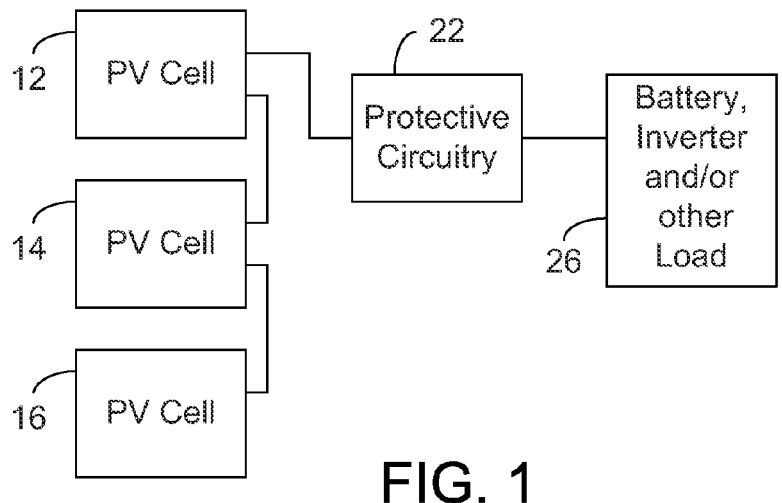
FIG. 1 illustrates a prior art system for charging a battery or providing power to another load using solar power.

The following describes a DC-to-DC power extractor for providing power from a power source to a load. The power extractor is called a power "extractor" because it operates in a way to obtain more power from a power source than typically would be obtained by the source without the operation. In examples provided in this disclosure, the power extractor operates to obtain impedance matching between the power source and the combination of the power extractor and the load, and between the load and the combination of the power source and the power extractor. This is called universal impedance matching because it occurs both as seen from the power source and as seen from the load. This impedance matching allows the power source to provide a greater amount of power than it would without the impedance matching. In some embodiments, discussed below, the power extractor is a power extraction switching converter.

In some embodiments, the impedance matching occurs as a consequence of the power extractor seeking a maximum power. In some embodiments, the power extractor causes impedance matching by changing the duty cycle of switching circuitry coupled to power transfer circuitry of the power extractor to cause increases in power until a maximum power is achieved. The changes to the duty cycle are made in response to detected power changes. In some embodiments, the power change is detected continuously through analog circuitry, while in other embodiments the power change is detected continuously through digital circuitry. In some embodiments, the detected power change includes a power slope, such as an instantaneous power slope. When the detected power change is zero at a true power maximum (not merely a local zero change), the power transferred is at a magnitude (level or amount) that the power source provides a maximum power given conditions beyond the control of the power extractor. In some embodiments, maximum available power is typically very closely approached. Actually achieving maximum available power is an example very closely approaching it. Examples of such conditions beyond the control of the power extractor that may apply for some power sources include environmental conditions (e.g., amount of sun light, temperature) and size of the power source (e.g., larger photovoltaic cells or larger number of cells may provide more power). If the power extractor's impedance is such that power is extracted at power at too high of a current or too high of a voltage or too low of a current or too low of a voltage, the power source will provide less than a maximum amount of power. The maximum amount of power will be obtained at a particular impedance. See FIGS. 9 and 10 and related discussion.

As used herein, a DC power source (called a power source herein), includes any source from which DC power might be generated and/or captured. Examples of DC power sources that may be used in accordance with embodiments of the invention include, but are not limited to, photovoltaic cells or panels, a battery or batteries, and sources that derive power through wind, water (e.g., hydroelectric), tidal forces, heat (e.g., thermal couple), hydrogen power generation, gas power generation, radioactive, mechanical deformation, piezo-electric, and motion (e.g., human motion such as walking, running, etc.). Power sources may include natural energy sources and man-made power sources, and may be stable (providing an essentially constant power but variable in magnitude) and unstable (providing power that varies over time). In some embodiments, the power sources include sub-power sources (e.g., a solar panel may multiple cells), while in other embodiments, the power source is unitary. A disadvantage of using sub-power sources is that they might have different impedances and a single power extractor may match with the combined impedance, which may be less optimal than having a separate power extractor for each power source. A "power source" may also be considered an "energy source."

Figure 2:
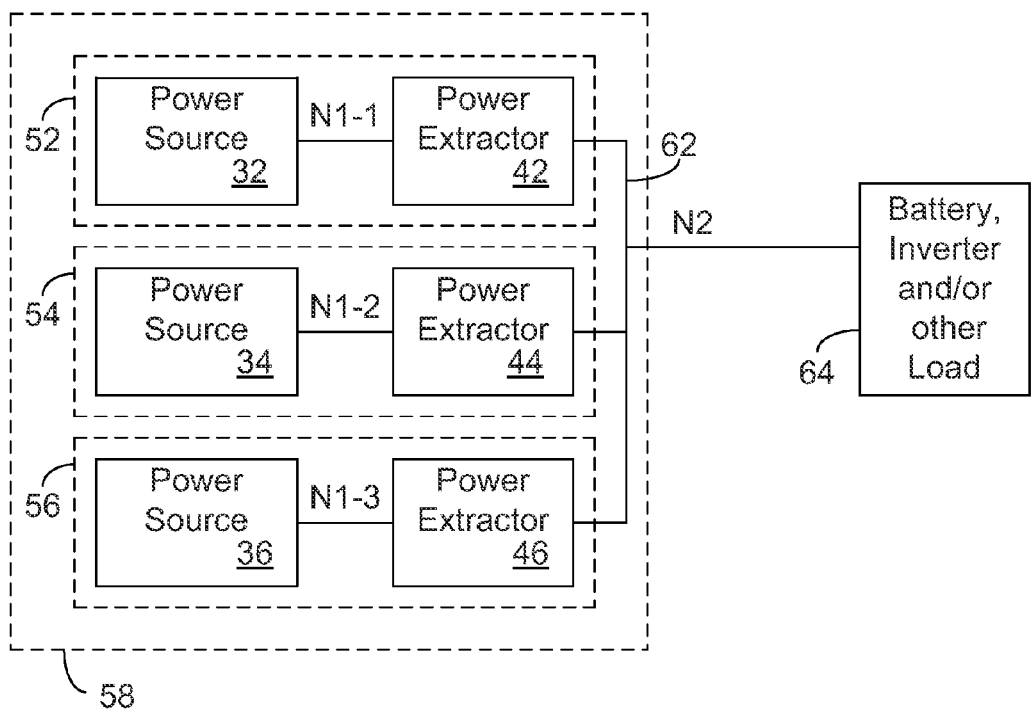
FIG. 2 illustrates an array of power sources and power extractors to provide power to a load according to some embodiments of the inventions.

FIG. 2 illustrates a system including power sources 32, 34, and 36 coupled to power extractors 42, 44, and 46, respectively. Power source 32 and power extractor 42 form a power unit 52 and may be physically separated as shown in FIG. 2 and adjacent as shown in other figures. Likewise, power sources 34 and 36 form power units 54 and 56. The output of power extractors 42, 44, and 46 are joined at a node N2 and cumulatively provide power to node N2. Load 64 is also joined to node N2. Load 64 may include a single load or sub-loads such as a battery (or batteries), an inverter and/or another sub-load or other load. Nodes N1-1, N1-2, and N1-3 are between power sources 32, 34, and 36 and power extractors 42, 44, and 46. Power units 52, 54, and 56 form a power assembly 58. A power assembly may include more than three power units or merely two power units. A load line 62 is illustrated. Unidirectional protection devices (e.g., diodes) may be used to prevent backflow of current to the power sources, but they are not required.

Figure 3:
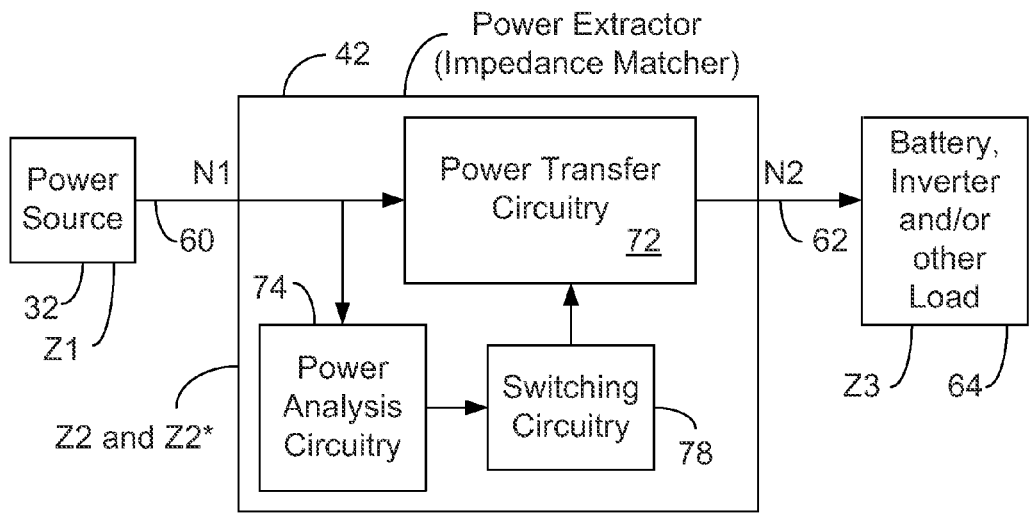
FIG. 3 illustrates a system including a power source, power extractor, and load configured according to some embodiments of the inventions.

FIG. 3 illustrates a system with a power source 32 having an output impedance Z1 coupled through a conductor 60 and node N1 to power extractor 42. Power extractor 42 is referred to as an impedance matcher, because as discussed above, in at least one mode of operation, it matches impedances as discussed. In some embodiments, power extractor 42 may operate in different modes. For example, in an ordinary operating mode (called a first mode herein), power extractor 42 operates to impedance match so that a maximum available power is provided by the power source. When it is said that power extractor 42 "operates to impedance match so that a maximum available power is provided" it is understood that, in practice, perfect impedance matching is typically not obtained and an absolute maximum available power is typically not obtained from the power source. Nevertheless, power extractor 42 operates so as to seek perfect impedance matching or to approach perfect impedance matching under closed-loop control including power analysis circuitry 74 and described below. In some embodiments, under steady state conditions, perfect impedance matching may be very closely approached.

Likewise, when it is said that the power transfer circuitry is to transfer the power at a magnitude to cause a power source to provide a maximum power available given conditions beyond the control of the power extractor, it is understand the power source approaches the maximum power under the closed-loop control of the power extractor. In some embodiments, that maximum available power is approached very closely. The power extractor may be said to seek to operate in a way to cause the power source to provide a maximum available power. Approaching perfect impedance matching or maximum power does not mean constantly moving closer and closer to perfect matching or maximum power. Sometimes, changes in the input impedance cause the impedance matching to be closer to perfect (or optimal) impedance matching and sometimes changes in the input impedance (or changes in the power source impedance) cause the impedance to be further from perfect matching, but overall the control loop causes a significant improvement in impedance matching compared to what it would be without the control loop. Likewise, with approaching maximum power.

In a protection mode (called a second mode herein), power extractor 42 operates to protect itself and/or load 64 and/or source 32. The protective mode may be entered into in response to a limiting condition. Examples of limiting conditions are excessive voltage, power, or current in the first node, power extractor, or second node; too little voltage, power, or current in the first node, power extractor, or second node; and a device limiting condition. In some embodiments, power extractor 42 detects only a some of these limiting conductions to determine whether to enter a protection mode. There may be additional modes and there may be more than one type of ordinary operating mode and more than one type of protection mode. For example, in at least one mode, power source conservation may be more important that achieve maximum power. This may be the case, for example, if the power source is a battery (see the example of FIG. 41).

Power extractor 42 includes power transfer circuitry 72 of FIG. 3 between nodes N1 and N2 and provides output power to a load 64 through a node N2 and load line 62. For convenience of illustration, power extractor 42 is shown as partially overlapping nodes N1 and N2. However, nodes N1 and N2 may be considered as being at the boundary of power extractor 42, but note discussion of FIGS. 8 and 15. Load 64 has an input impedance Z3. Power extractor 42 includes power analysis circuitry 74 that analyzes the power and provides a switching circuitry control signal to control switching circuitry 78. Switching circuitry 78 operates to at least partially control the operation of power transfer circuitry 72. Power extractor 42 includes an input impedance of Z2 and an output impedance of Z2*. When changes in power are detected, power analysis circuitry 74 responds by adjusting the timing (e.g., duty cycle) of switching circuitry 78. Switching circuitry 78 may also react in a manner that seeks to maximize energy transfer efficiency through, for example, changing a frequency of switching of switching circuitry 78.

Figure 4:
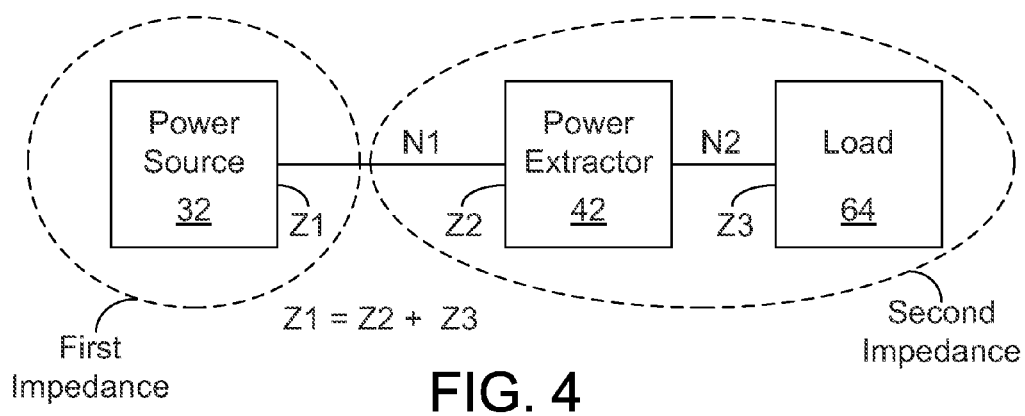
FIG. 4 illustrates impedance matching characteristics of a power extractor as viewed from a power source according to various embodiments of the inventions.
Figure 5:
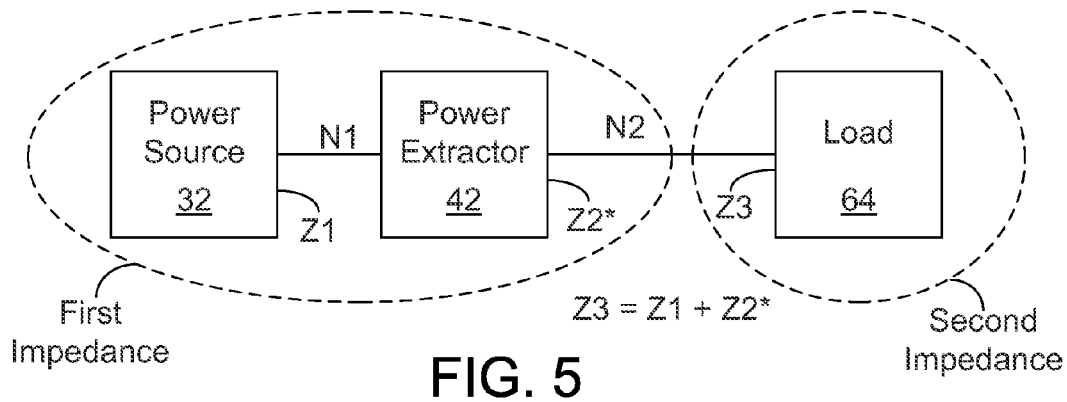
FIG. 5 illustrates the impedance matching characteristics of a power extractor as viewed from a load according to various embodiments of the inventions.

FIGS. 4 and 5 illustrate the impedance matching characteristics of power extractor 42 of FIG. 3. In FIG. 4, power source 32 has impedance Z1, called a first impedance in FIG. 4. Power extractor 42 has input impedance Z2 while load 64 has the impedance Z3. In FIG. 4, the combination of Z2 and Z3 is called a second impedance. The impedance as seen by power source 32 when looking at the power extractor 42 is equal to its own impedance. In other words, power extractor 42 dynamically matches the impedance of power source 32 (i.e., Z1=Z2+Z3) so that the first and second impedances equal each other.

FIG. 5 illustrates that the impedance as seen by load 64 when looking at power extractor 42 is also equal to its own impedance. In FIG. 5, the first impedance is Z1 and Z2* (the output impedance of power extractor 42) and the second impedance is Z3. Load 64 sees output impedance Z2* on power extractor 42. Thus, power extractor 42 also dynamically matches the impedance of the load (i.e., Z3=Z1+Z2*) so that the first and second impedances are matched. Given that the impedance of power extractor 42 is typically different (Z2 or Z2*) depending whether the impedance is measured at N1 or N2, the impedances (Z2+Z3) as seen by the power source and (Z1+Z2*) as seen by the load may be thought of as virtual impedances.

In some embodiments, whether power extractor 42 seeks to impedance match with power source 32 depends on whether load 64 can receive all the power that power source 32 can provide. If load 64 can receive more than source 32 can provide, then power extractor 42 seeks to have its input impedance match with the output impedance of power source 32, but does not necessarily seek to have its output impedance match with the input impedance of load 64. If load 64 can receive less than power source 32 can provide, then power extractor 42 may go into a mode (possibly a protection mode) in which it does not seek to have its input impedance match with the output impedance of power source 32, but may seek to match its output impedance with the input impedance of load 64. If load 64 can receive exactly or essentially exactly what source 32 can provide, then power extractor 42 may seek to have its input impedance match with the output impedance of power source 32 and its output impedance match with the input impedance of load 64. In other embodiments, power extractor 42 may operate different. Impedance matching at the output node (node N2 in FIG. 3) may occur when power extractors are connected together.

Figure 6:
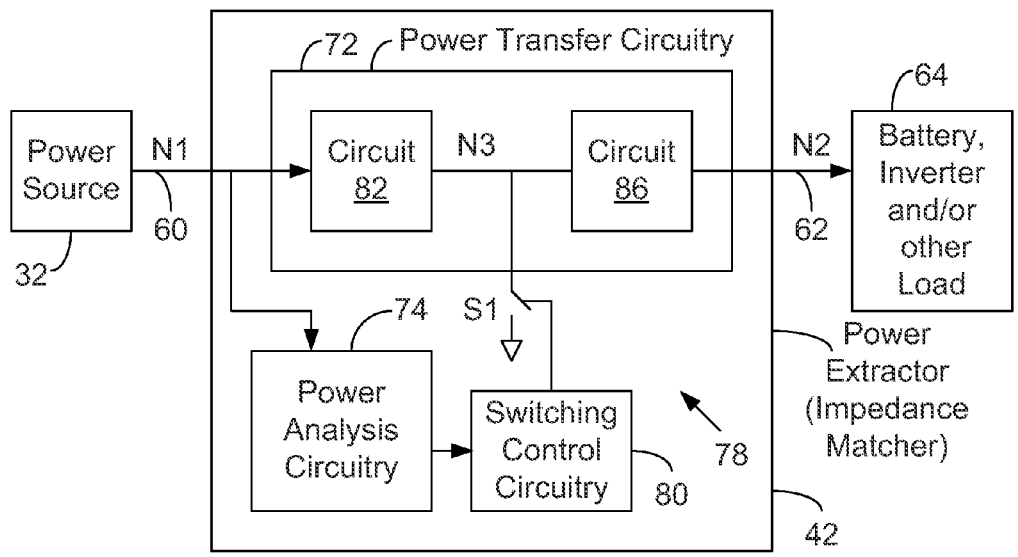
FIGS. 6 and 7 each illustrate a system including a power source, power extractor, and load according to some embodiments of the inventions.

FIG. 6 illustrates a circuit 82 and a circuit 86 separated by a node N3 in power transfer circuitry 72. Impedances of circuits 82 and 86 may be coadjutive (rendering mutual aid) and are modulated so that the aggregate impedance of power extractor 42 and load 64 is matched to the output impedance of power source 32. In some embodiments and situations, the aggregate impedance of power source 32 and power extractor 42 is matched to the input impedance of load 64. Power is continuously transferred from power source 32 through circuit 82. The duty cycle of S1 is dynamically adjusted to facilitate the virtual impedance matching to the power source 32. Once the impedances are matched, the power extracted from power source 32 is maximized. Likewise, power is continuously transferred from circuit 86 to load 64. The amount of power driven into load 64 is maximized when the impedance of circuit 86 is matched with the impedance of load 64. A control loop 70 includes power analysis circuitry 74 and switching control circuitry 80. In some embodiments, control loop 70 is partly implemented with software. Switch S1 is controlled by switching control circuitry 80. Power change analysis circuitry 74 detects changes in power from power source 32 at node N1 and communicates with switching control circuitry 80. Switching control circuitry 80 controls, for example, the duty cycle of S1 so as to increase power as described below.

Figure 7:
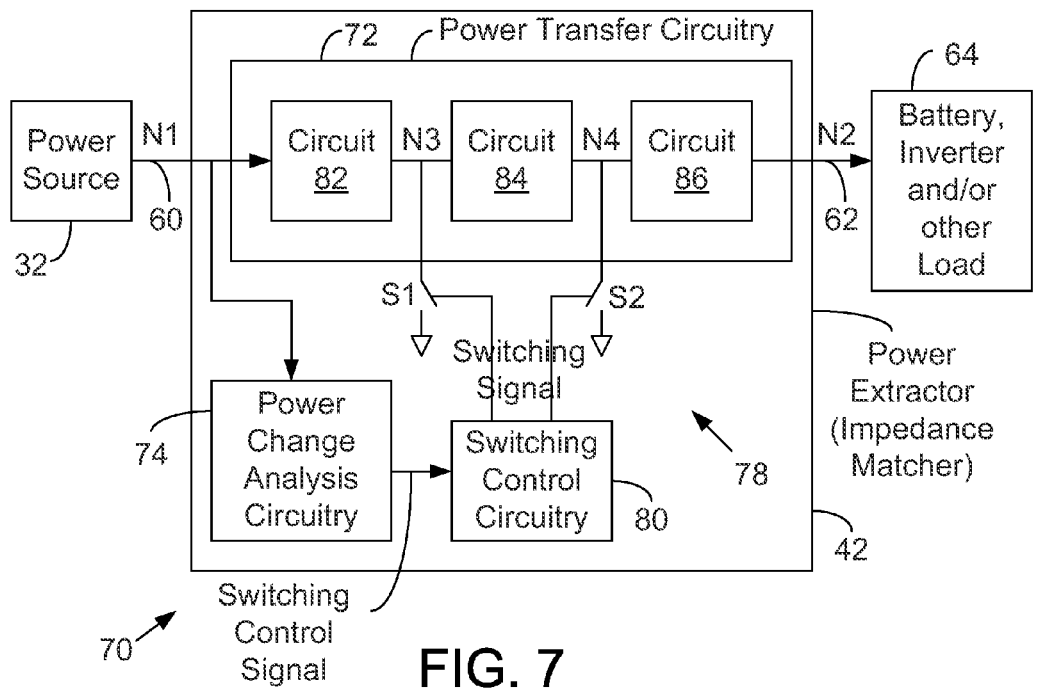

FIG. 7 illustrates another power transfer circuitry configuration that may be used in some embodiments of the invention. In FIG. 7, power transfer circuitry 72 includes a circuit 84 between circuits 82 and 86, with node N3 between circuits 82 and 84 and node N4 between circuits 84 and 86. Switching control circuitry 80 provides a switching signal(s) to control switches S1 and S2. In some embodiments, the duty cycle of the switching signal to S1 is the inverse of the duty cycle of the switching signal to S2. In other embodiments, the switching signals to S1 and S2 are intentionally not inverses of each other. In some embodiments, there may be additional switches. Circuits 82, 84, and 86 may be coadjutive impedances and are modulated by switches S1 and S2 under the control of switching control circuitry 80 such that the aggregate impedance of power extractor 42 and load 64 matches the output impedance of power source 32, and the aggregate impedance of power source 32 and power extractor 42 matches the input impedance of load 64. When the impedance of power source 32 is matched with the combination of power extractor 42 and load 64, circuit 72 is able to extract maximum power from power source 32.

In some embodiments, circuit 84 transfers accumulated voltage potential from N3 to N4 without interrupting the flow of power from circuit 82 to circuit 86. Circuit 86 adapts its output impedance to facilitate impedance matching with load 64. The duty cycle of S2 is dynamically adjusted to cause the impedance matching between circuit 86 and load 64. Thus, circuit 86 is able to transfer maximum power into load 64. While circuit 86 is transferring power to load 64, circuit 82 continues to match its impedance with the impedance of power source 32 allowing maximum power to be transferred from power source 32 through circuit 82. This process continues as S1 and S2 are alternately opened and closed according to the duty cycle of the switching signal. In some embodiments, the switch states of S1 and S2 are controlled by switching control circuitry 80 which receives the switching control signal from power change analysis circuitry 74 based on the changes in power available at N1. Alternatively, the power change detected can be a power change at a place other than node N1 such as node N2 or inside power extractor 42.

Figure 8:
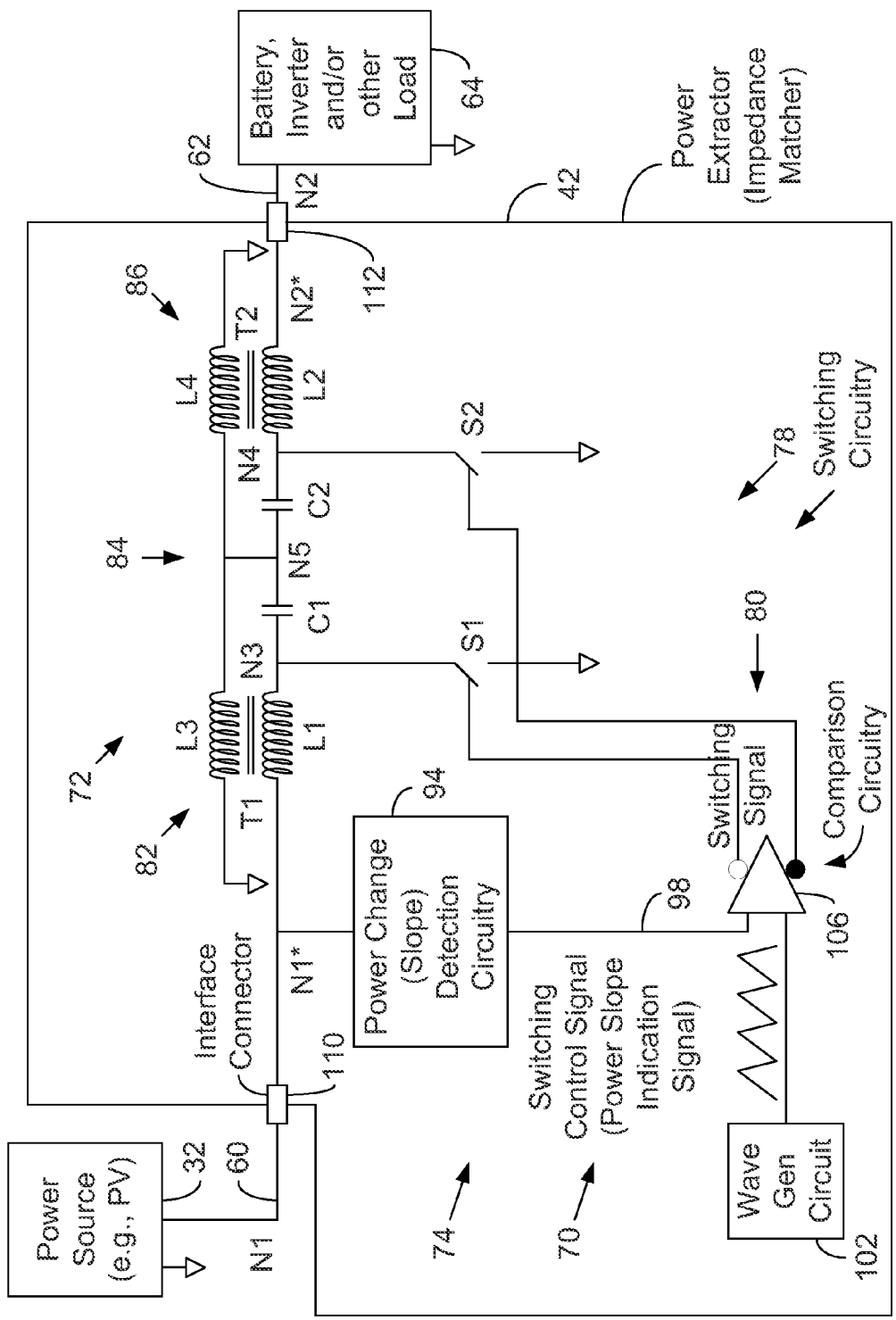
FIG. 8 illustrates details of some embodiments of the system of FIG. 7.

FIG. 8 illustrates details that are included in some embodiments of FIGS. 5 and 7, but other embodiments include different details. Referring to FIG. 8, power change analysis circuitry 74 includes power change detection circuitry 94 and other circuitry shown in other figures. Power transfer circuitry 72 includes circuits 82, 84, and 86. Circuits 82 and 84 include transformer T1 (including inductors L1 and L3) and transformer T2 (including inductors L2 and L4). Circuit 82 includes capacitors C1 and C2 and a node N5 separating C1 and C2 and connected to inductors L3 and L4. Power source is coupled to inductor L1 through conductor 60 of node N1, an interface connector 110, and a node N1*. As an example, connector 110 may be a plug receptacle (see also FIG. 15). If the impedance difference between N1, connector 110, and N1* are relatively small, then they may be considered one node. Otherwise, they may be considered more than one mode. Likewise with node N2*, connector 112, and node N2. Inductor L1 is between nodes N1* and N3, and inductor L2 is between nodes N4 and N2*.

Power change detection circuitry 94 detects a power change of power at node N1* and provides a switching control signal on conductor 98 to one input of comparison circuitry 80. In some embodiments, power change detection circuitry 94 detects a slope of the power change and may be called power slope detection circuitry 94 and provide a power slope indication signal (as shown in FIG. 8). In some embodiments, the power slope is an instantaneous power slope. Another input of comparison circuitry 106 receives a waveform such as a saw tooth wave from waveform generator circuit 102. Comparison circuitry 106 controls a duty cycle of switches S1 and S2. In some embodiments, S1 and S2 are not both open or both closed at the same time (with the possible exception of brief transitions when they are switching). Waveform generator circuit 102 and comparison circuitry 106 are examples of circuitry in switching control circuitry 80.

When S1 is closed, electromagnetic fields change in T1 and T2 while the electrostatic potential across C1 and C2 is altered and energy from power source 32 is distributed electromagnetically into T1 and T2, while electrostatically in C1 and C2. When S1 opens, S2 closes and the magnetic flux in T1 begins to decrease. Thus, the energy stored in T1 flows through N3 to capacitors C1 and C2 of circuit 84, depositing some of the energy as an electrostatic field onto C1 and C2, and some of the energy into T2 of circuit 86 through node N5 and inductor L4. The residual flux in T2 also begins to decrease, transferring energy into the load 64 through N2. When S1 closes and S2 opens again, the magnetic flux in T1 begins to increase while the magnetic flux T2 also increases as it consumes some of the electrostatic energy that was previously stored onto C1 and C2. Thus energy stored in circuit 84 is discharged and transferred to T2 and load 64.

Multi-phase energy transfer combines two or more phased inputs to produce a resultant flux in a magnetic core equivalent to the angular bisector of the inputs. (Note: an angle bisector of an angle is known to be the locus of points equidistant from the two rays (half-lines) forming the angle.) In this embodiment of the power extractor, capacitors C1 and C2 are used to shift the phase of the current that is applied to the secondary winding of T1 and T2 (L3 and L4 respectively). Thus, multi-phased inputs are applied to the cores of T2 and T3. The summation of the multiphase inputs alter the electromotive force that present during the increase and reduction of flux in the transformers primary windings L1 and L3 The result is the neutralization (within the bandwidth of the operational frequency of the power extractor) of high frequency variations in the reactive component of the impedance that circuits 82 and 86 exhibit to the source and load respectively. Circuits 82 and 86 may be multiphase bisector energy transfer circuits to cause the multiphase bisector energy transfer and to interface with circuit 84.

Due to the dynamic properties of circuit 82, power source 32 "sees" an equivalent impedance at inductor L1 power extractor 42. Likewise, with inductor L2 and load 64. The input and output impedances of power extractor 42 are adjusted by controlling the duty cycle of S1 and S2. Optimal matching of impedances to the power source 32 occurs when maximum power extraction from the power source is achieved.

Power slope detection circuitry 94, power change indication signal, and comparison circuitry 106 are part of a control loop that controls the duty cycle of switching circuitry 78 to achieve maximum power extraction (i.e., $\Delta P/\Delta V=0$) from power source 32. The control loop may also control the switching frequency of switching circuitry 78 to influence the efficiency of power transfer through the power transfer circuitry 72. Merely as an example, the frequency may be in the range of 100 KHz to 250 KHz depending on saturation limits of inductors. However, in other embodiments, the frequencies may be substantially different. The size and other aspects of the inductors and associated cores and other components such as capacitors can be chosen to meet various criterion including a desired power transfer ability, efficiency, and available space. In some embodiments, the frequency can be changed by changing the frequency of the waveform from waveform generator circuit 102. Other figures show a control of circuit 102. In some embodiments, the frequency is controlled by a control loop as a function of whether an on-time rise of current is between a minimum and maximum current in a energy transfer circuit.

As used herein, the duty cycle of switching circuitry 78 is the ratio of the on-time of S1 to the total on-time of S1 and S2 (i.e., duty cycle=S1/(S1+S2)). The duty cycle could be defined by a different ratio associated with S1 and/or S2 in other embodiments. When the voltages of power source 32 and load 64 are equal and the duty cycle is 50%, there is zero power transfer through power extractor 42 in some embodiments. If the voltages of power source 32 and load 64 are different, a higher or lower duty cycle may cause zero power transfer through power extractor 42. In other words, a particular duty cycle of switching circuitry 78 is not tied to a particular direction or amount of power transfer through power transfer circuitry 72.

As noted, the power change can be continuously detected and the switching control signal (of FIGS. 7, 8, and 11) can be continuously updated. Using analog circuits is one way to perform continuous detection and updating. Using digital circuits (such as a processor) is another way to perform continuous detection and switching control signal updating. Even though the updating from some digital circuits may in some sense not be exactly continuous, it may be considered continuous when for all practical purposes it produces the same result as truly continuous updating. As an example, the updating of the switching control signal is also considered continuous when the frequency of change is outside the control loop bandwidth. In some cases, the updating of the switching control signal also could be considered continuous when the frequency of change is within the control bandwidth. Merely as an example, in some implementations, the control loop bandwidth may be around 800 Hz. In other embodiments, the control loop bandwidth is higher than 800 Hz, and perhaps much higher than 800 Hz. In still other embodiments, the control loop bandwidth is lower than 800 Hz and depending on the desired implementation and performance may be lower than 400 Hz.

FIG. 9 illustrates an example of a typical current-voltage (I-V) curve and a power curve. Many power sources (e.g., a solar panel) produce a relatively constant current at different voltages. However, when the voltage reaches a certain threshold in these power sources, the current begins to drop quickly. The threshold voltage corresponds to a knee region in the I-V curve. The maximum power point ($P_{max}$) also corresponds to the knee region in the I-V curve.

FIG. 10 is a table illustrating operational concepts for power extractor 42 according to various embodiments. Example (1), shown as arrow (1) on FIG. 9, shows that when power and voltage are both increasing, the operating point of the power extractor is on the left side of $P_{max}$. When operating on the left side of $P_{max}$, too much current is being drawn by power extractor 42 from power source 32 and, accordingly, power source 32 is providing less than a maximum available power from power source 32. The maximum available power is the most amount of power that could be achieved given environmental conditions and other conditions beyond the control of power extractor 42. In order to reduce current flow, the duty cycle of switching control circuitry 78 is decreased. This is also the case with example (2) in which arrow (2) shows that when power and voltage are both decreasing, there is also too much current and less than a maximum available power from power source 32. Conversely, when operating on the right side of $P_{max}$ (examples (3) and (4)), too little current is being drawn by the power extractor and less than a maximum available power from power source 32. Thus, in order to increase the current flow, the duty cycle of switching control circuitry 89 is increased. FIGS. 9 and 10 illustrate a specification implementation under particular conditions. Other implementations may operate differently and involve additional factors. In a different implementation, the current could be increased by decreasing the duty cycle.

Referring again to FIG. 9, if the power is at Pmax for a length of time, then the power and voltage is neither increasing nor decreasing for that length of time. Accordingly, the duty cycle may remain the same. In some embodiments, the control loop includes mechanisms to prevent a local power maximum (local minimum slope) that is not a true maximum power from being interpreted as a power maximum so the duty cycle is not changed. One mechanism is the natural noise that will tend to cause control loop fluctuations resulting in the power change. Another mechanism is artificially induced control loop fluctuations that in some implementations may result in the duty cycle changing after a particular amount of time if the detection circuitry shows no change in power or voltage.

Power slope detection circuitry 94 creates the switching control signal in response to the situation of FIG. 10. FIG. 11 illustrates how comparison circuitry 106 compares the switching control signal with the saw tooth waveform. The duty cycle of switching control circuitry 78 changes as the area of the saw-tooth wave above the switching control signal changes. For example, the area of the saw-tooth wave above the switching control signal is smaller from time $t_3$ to $t_4$ than from time $t_1$ to $t_2$. The smaller area above the switching control signal corresponds to a lower duty cycle. The smaller area above the switching control signal could correspond to a higher duty cycle in other embodiments. The voltages 0.5 V1 and 0.6 V1 are used for purposes of illustration and are not limiting. Additionally, in other embodiments, other waveforms (triangle, sine, etc.) could be used in place of the saw-tooth wave.

Figure 12:
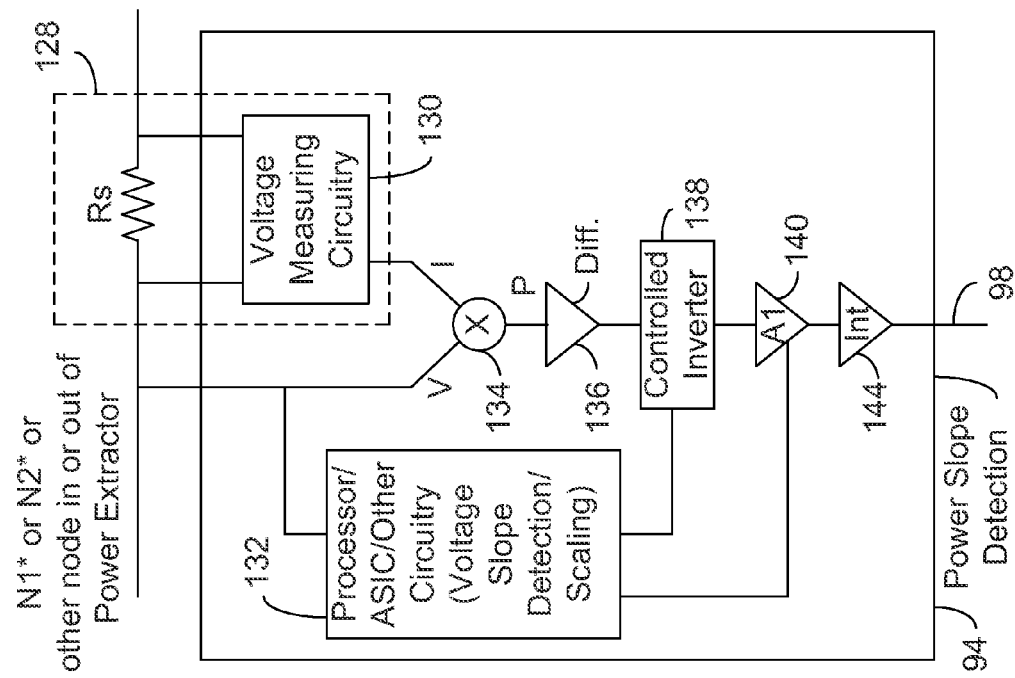
FIGS. 12 and 13 are each a block diagram illustrating power slope detection circuitry according to some embodiments.
Figure 13:
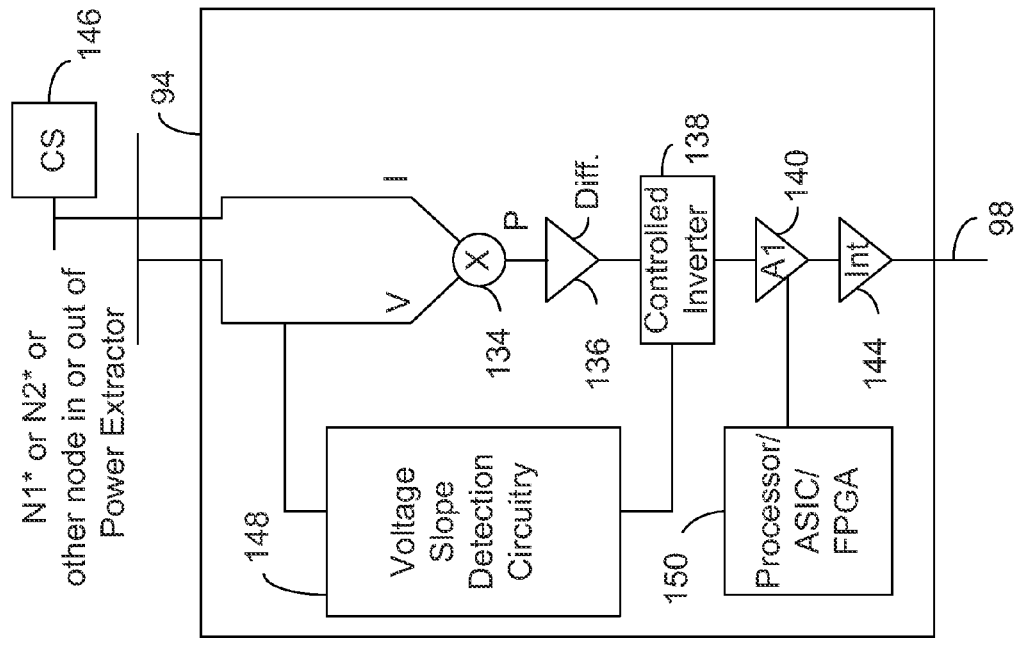

FIGS. 12 and 13 illustrate examples of power slope detection circuitry 94 that may be used in some embodiments of the invention. There are various other ways to implement the same or similar functions. In FIG. 12, a current measuring circuit 128 includes voltage measuring circuitry 130 internal to power slope detection circuitry 94 to measures the voltage across a small resistor Rs at N1 (or at another location) to determine the current (I=V/R). Although a small resistor Rs is shown, there are various other ways to measure current including through measuring a magnetic field. The voltage-level signal from N1 (i.e., VN1) (or at another location) and the current-level signal from N1 (i.e., IN1) (or at another location) are continuous signals. (In other embodiments, the voltage is deduced indirectly.) Multiplier 134 continuously multiplies the voltage and current at N1 to determine the power at N1 (PN1).

Differentiator 136 provided a signal responsive to changes in power ($\Delta P$) while processor 132 provides a signal responsive to changes in voltage ($\Delta V$). In some embodiments, differentiator 136 measures the power slope. $\Delta P/\Delta V$ represents the slope power at node N1 (or the other location). Maximum power is achieved when $\Delta P/\Delta V=0$. The slope of the power (or merely power change) can be determined in various ways. The power slope may be an instantaneous power slope determined through analog circuitry. Alternatively, a power slope or merely a power change can be detected through digital circuitry such as a processor by comparing samples. The processor could compare samples and determine a slope and a corresponding change in voltage (or a voltage slope). Alternatively, the processor could merely determine whether the power is increasing or decreasing and whether the corresponding voltage is increasing or decreasing. In some embodiments, differentiator 136 merely provides a magnitude of the power change (power slope) and in other embodiments, it provides both a magnitude and a direction. For example, the slope at point (1) in FIG. 9 is positive in direction while the slope at point (2) is negative in direction despite having a similar magnitude.

Power slope detection circuitry 94 includes voltage change detection circuitry 132, which may be a processor, application specific integrated circuit (ASIC), or other circuitry. Circuitry 132 may also perform scaling as discussed. In some embodiments, circuitry 94 detects a slope of voltage change and in other embodiments, and in other embodiments, it merely detects whether the voltage is increasing or decreasing. It may detect the change through analog or digital circuitry. In some embodiments, only the direction (i.e., not the magnitude) of the voltage change is relevant. Referring again to FIG. 9, example (1) involves an increasing voltage (positive) while example (2) involves a decreasing voltage (negative). Thus, in example (2) of FIG. 10, when differentiator 136 indicates a decrease in power, voltage change detection circuitry 132 indicates a decrease in voltage. When there is a decrease in voltage, controlled inverter 138 inverts the negative output of differentiator 136, which results in a positive number corresponding to the positive power slope at point (2). Thus, by combining the results of differentiator 136 and voltage change detection circuitry 132, power slope detection circuitry 94 can determine whether to increase or decrease the current. As shown in FIG. 10, when the power slope is positive (examples (1) and (2)), the duty cycle of switching circuitry 78 is decreased; when the power slope is negative (examples (3) and (4), the duty cycle is increased. In some embodiments, the output of controlled inverter 138 is scaled by a scalar (amplifier A1) 140, which puts the signal in a proper range to be compared with the waveform (as shown in FIG. 11). Further, in some embodiments, an integrated 144 may be used to act as a low pass filter and smooth out otherwise rapid changes.

In some embodiments, the switching control signal is dependent on the steepness of the power slope or amount of power change, and in other embodiments, the changes are incremental. In some embodiments, circuitry 94 does not model a power curve, it merely responds to detected voltage and current changes to move toward the maximum power, without being aware of where the maximum power on a curve. Indeed, it is not necessary to know what the power curve would look like. In other embodiments, circuitry 94 or other circuitry such as processor 172 in FIG. 25 models a power curve.

In some embodiments, the input (e.g., voltage and/or current) and the control loop may define the saturation limit for each of the inductors in power transfer circuitry 72. In other words, the saturation limit of each of the inductors may be independent of the power extractor output and switching frequency.

FIG. 13 shows how changes in voltage can be detected by analog detection circuitry 148 (e.g., differentiator, etc) in some embodiments. Additionally, an external current sensor 146 can measure the amount of current being transferred by the power extractor and communicate that information to power slope detection circuitry 94. Amplifier 140 can also be controlled by a processor, ASIC, or FPGA 150 based on various conditions including but not limited to weather conditions, and charge level of the load (e.g., battery).

Figure 14:
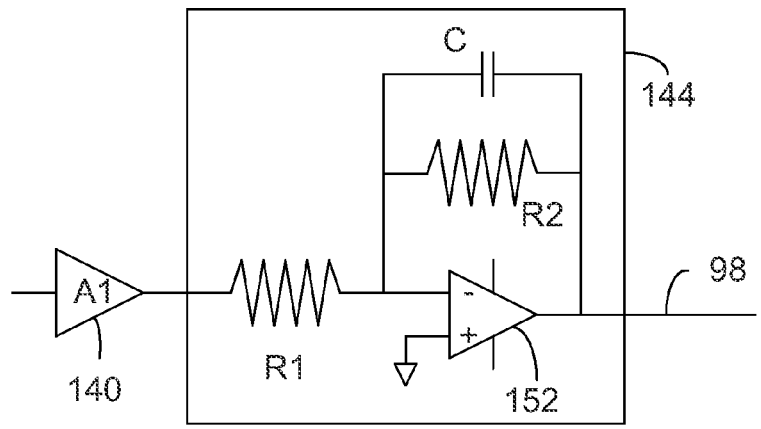
FIG. 14 is a block diagram illustrating an example of an integrator circuit that may be used in some embodiments.

FIG. 14 illustrates an example of the optional integrator 144 of FIGS. 12 and 13. Integrator 144 may be included in some embodiments of power slope detection circuitry 94 to dampen the switching control signal from power slope detection circuitry 94. Integrator 144 includes a resistor R1 at the input of an op amp 152 and a resistor R2 in parallel with a capacitor C. Charge stored in the capacitor is "bled off" by resistor R2. The bleeding off of charge by resistor R2 causes the output of integrator 144 to be lower over time than the input (as received from power slope detection circuitry). This reduced output reduces the impact (i.e., dampens) of switching control signal on the duty cycle of switching circuitry 78.

There are various other ways to obtain the switching control signal. Examples include doing all the analysis in a processor. Other examples, involve considering the saturation levels of the inductors. An example is illustrated in connection with FIG. 28. A phase-locked loop (PLL) may be used to detect on and off times of switches S1 and S2. This information could be provided to the processor which may use the information for various purposes. Two phase related signals may be used in connection with controlling the duty cycle.

Figure 15:
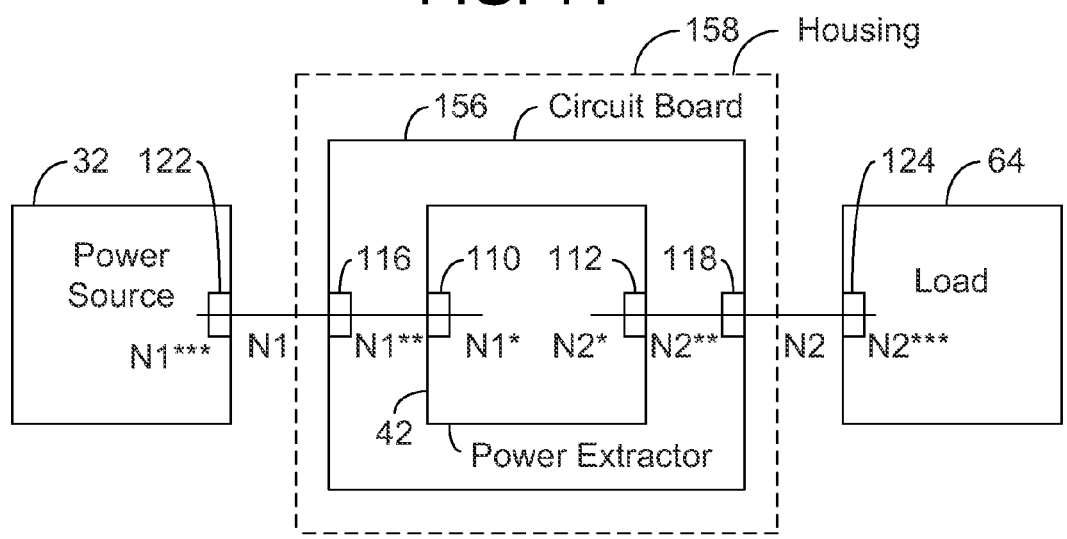
FIG. 15 illustrates various connectors for connecting a power source and a load to a power extractor and/or a circuit board according to some embodiments.

FIG. 15 shows several connectors (110, 112, 116, 118, 122, and 124) for connecting power source 32 and load 64 to power extractor 42 and/or a circuit board 156 as shown. Circuit board 156 may be in a housing 158. Circuit board 156 and housing 158 may be in a wide variety of forms including, for example, a stand alone box. Alternatively, circuit board 156 could be in a consumer electronics device (e.g., cell phone, personal data assistant (PDA)) or be a computer card in which case the load could be integrated in the housing as well, or in a variety of other implementations. As described below, in some implementations, the power source could be integrated with the housing. If the connector has a substantially different impedance than the surrounding nodes, then the different nodes (e.g., N1, N1*, N1**) can be considered separate nodes. If the connector has a relatively little impedance than the surrounding nodes, then the different nodes can be considered one node.

Figure 16:
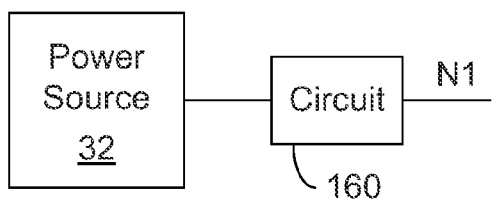
FIG. 16 shows a circuit between a power source and a node according to some embodiments.
Figure 17:
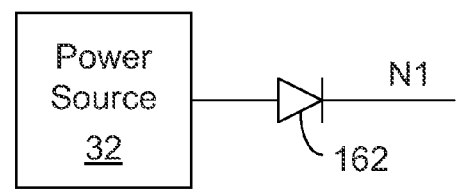
FIG. 17 shows a diode between a power source and a node according to some embodiments.

FIG. 16 shows that a circuit 160 can be included between power source 32 and node N1 in some embodiments. FIG. 17 shows that a diode 162 can be included between power source 32 and N1 in some embodiments.

Figure 18:
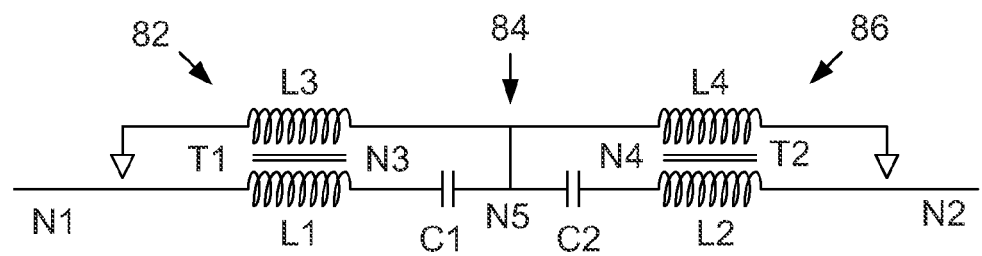
FIG. 18 illustrates an example of power transfer circuitry of FIG. 8.
Figure 19:
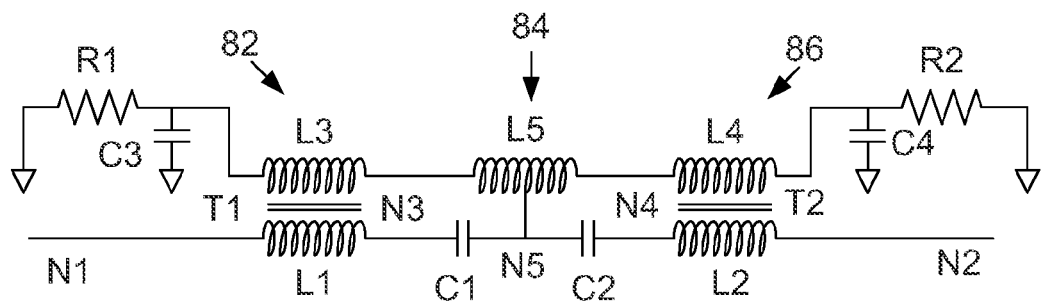
FIGS. 19-22 each illustrate an example of power transfer circuitry according to some embodiments.
Figure 20:
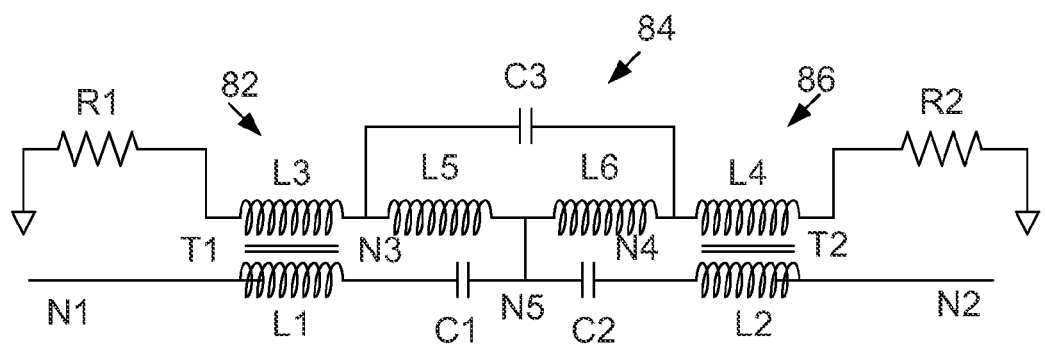
Figure 21:
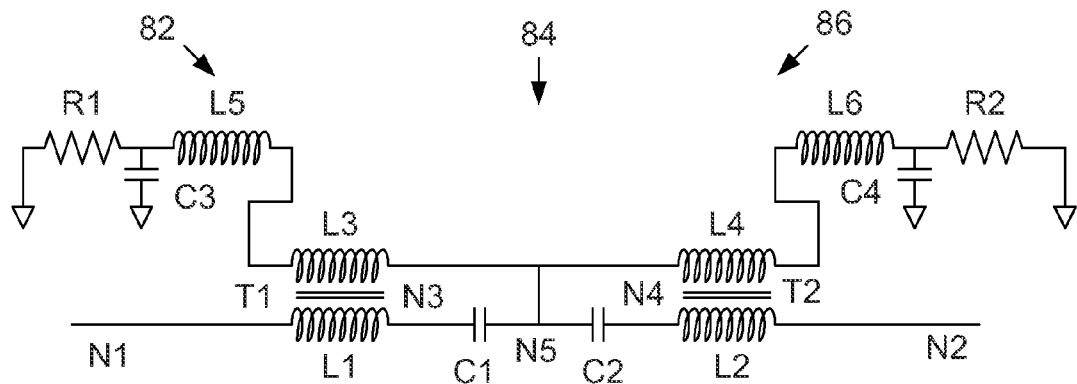
Figure 22:
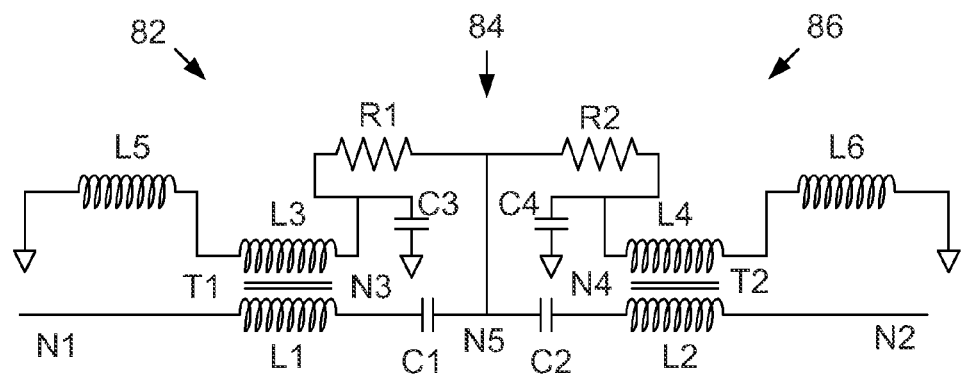

FIG. 18 reproduces the power transfer circuitry of FIG. 8 for convenience of comparison with alternative power transfer circuitry illustrated in FIGS. 19-22. The values of the resistors, capacitors and inductors (such as R1, R2 C1, C2, C3, C4, L1, L2, L3, L4, L5, and L6) are not necessarily the same in FIGS. 18-22.

Figures 23, 24:
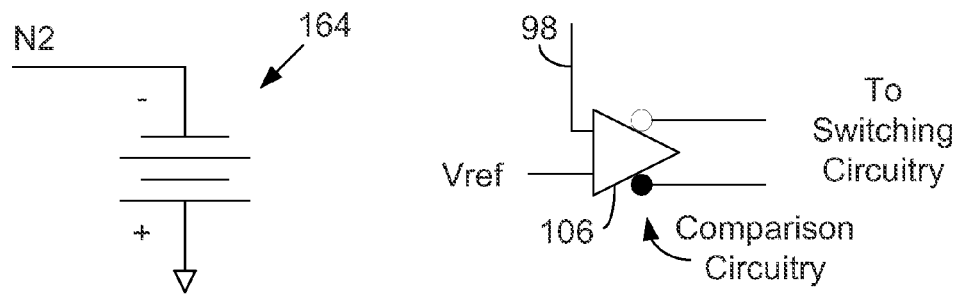
FIG. 23 illustrates a battery where the positive end of the battery is connected to ground.
FIG. 24 illustrates comparison circuitry that may be used in some embodiments.

FIG. 23 illustrates a battery 164 of which the positive end of the battery is connected to ground. N2 represents the node at the output of power extractor 42. In some embodiments, a battery 164 is connected to N2 such that the negative end of battery 164 is tied to N2 and the positive end is tied to ground. Referring to FIGS. 7 and 8, one reason to have the arrangement of FIG. 23 is that, in some embodiments, the voltages at N4 and N3 have opposite polarities. For example, if the voltage at N3 and N4 are VN3 and VN4, respectively, VN3 may be VN4. In other embodiments, battery 164 can be connected such that the positive end is tied to N2 and the negative end is tied to ground. Further, in some embodiments, the voltage at N4 and N3 are not opposite voltages.

FIG. 24 illustrates an example of comparison circuitry that may be used in some embodiments of the invention. Comparison circuitry 106 can be any circuitry used to compare power change indication signal 98 with a reference signal (e.g., a voltage reference, $V_{ref}$) in order to regulate the duty cycle of the switching circuitry.

Figure 25:
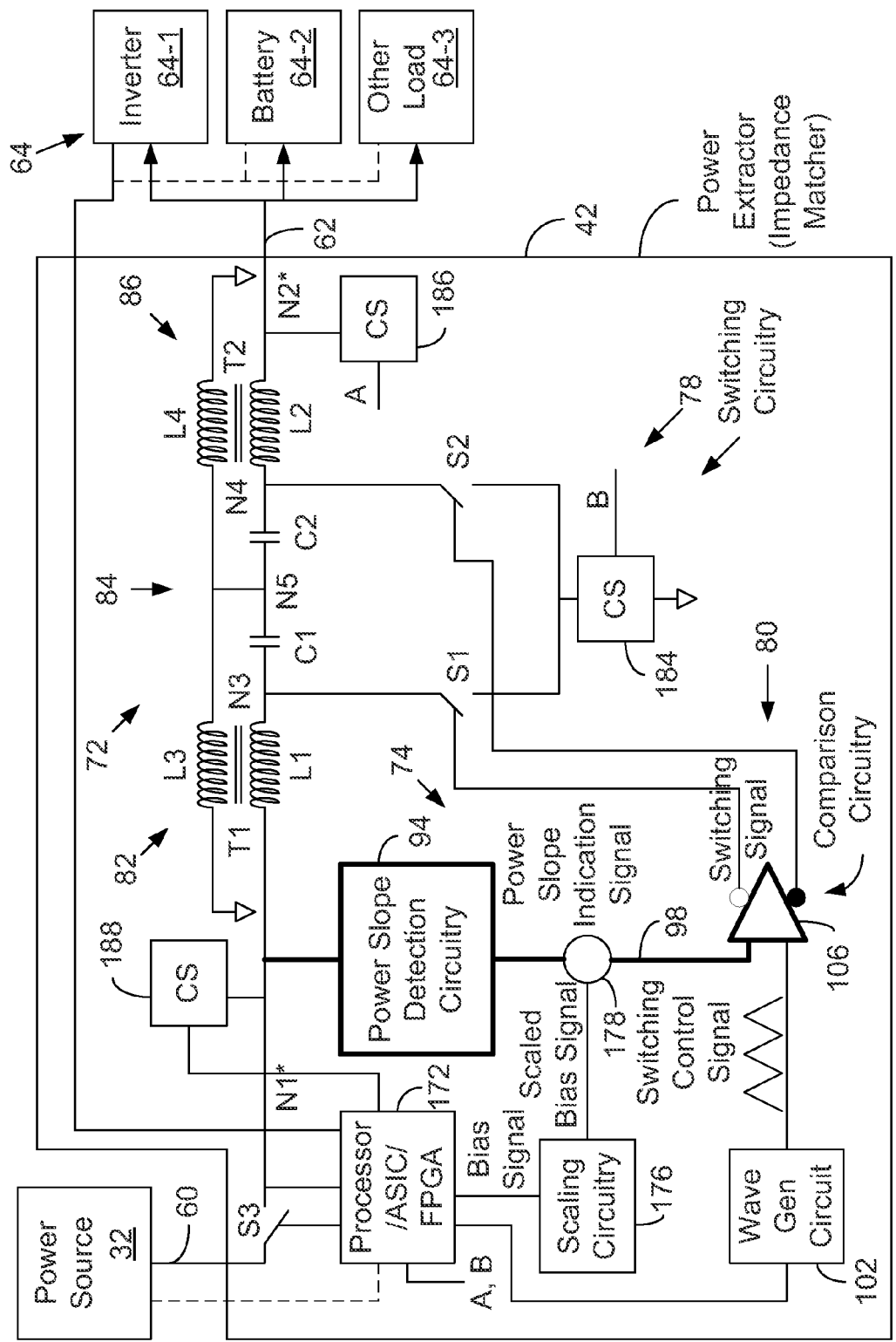
FIG. 25 illustrates a system including a power source, power extractor, and load according to some embodiments.

FIG. 25 is similar to FIG. 8, but includes additional circuitry including a processor/ASIC/and/or field programmable gate array (FPGA) 172 (hereinafter processor 172), scaling circuitry 176, current sensors 184, 186, and 188. Processor 172 receives signals indicative of the sensed current as well as voltage of node N1*. Letters A and B show connections between current sensors 184 and 186 and processor 172. In some embodiments, processor 172 also gathers information and/or provides control to sub-loads inverter 64-1, battery 64-2, and/or other load 64-3 of load 64. The current information can be used to indicate such information as the rate, amount, and efficiency of power transfer. One reason to gather this information is for processor 172 to determine whether to be in the protection mode (such as the second mode) or the ordinary operating mode (such as the first mode). In a protection mode, there are various things processor 172 can do to provide the power extractor 42 or load 64. One option is to open switch S3. Another option is to open a switch S4 shown in FIG. 26. Another option is to provide a bias signal to scaling circuitry 176 which is combined in circuitry 178 with a power slope indication signal to create the switching control signal on conductor 98. For example, if the bias signal causes the switching control signal to be very high, the duty cycle would be low causing the current to be small. The regulation of power in the protection mode can be to completely shut off the power or merely to reduce the power. In the protection mode, the goal is no longer to maximize the power transferred. In some embodiments, the bias signal is asserted for purposes other than merely protection mode.

Figure 26:
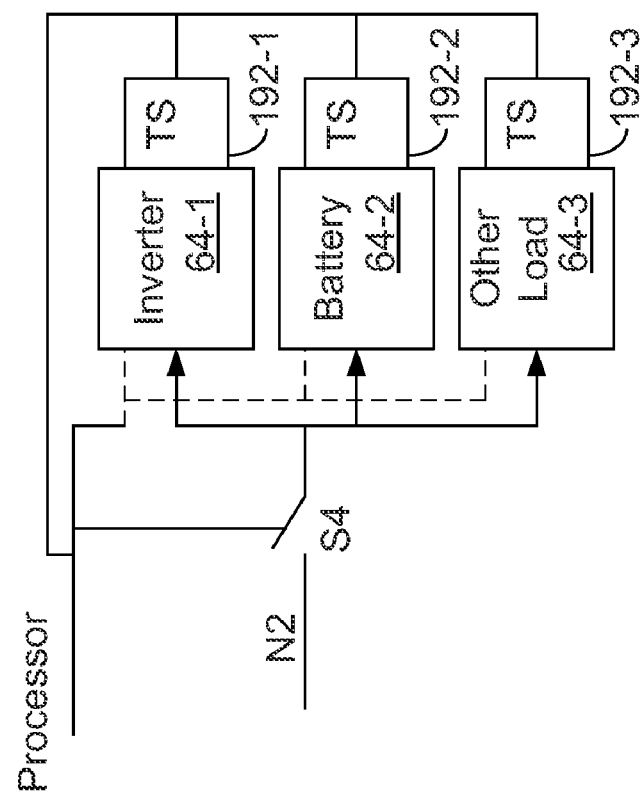
FIG. 26 illustrates processor control in connection with a load according to some embodiments.

FIG. 26 illustrates a processor control line to control a switch, S4, which can be opened to shut off any power transfer from power extractor 42 to a load (e.g., inverter 64-1, battery 64-2, and/or other load 64-3). Processor 172 also controls the routing of power between different sub-loads (e.g., inverter 64-1, battery 64-2, or other load 64-3) in some embodiments. Furthermore, temperature sensors 192-1, 192-3, and 192-3 are shown as being connected to different loads. Based on the temperature (e.g., too much heat), the processor can cause switch S4 to open or close or otherwise regulate power, such as through the bias signal or opening switch S3. Power extractor 42 can operate in a protective mode based on any device limiting condition. Examples of device limiting conditions include one or more of the following: excessive heat, voltage, power, or current in N1, power extractor 42, and/or N2. There may be other device limiting conditions. The power extractor may sense the state of external switches such as dip switches or get updates through a memory (such as a flash memory) to determine load characteristics that may be considered in deciding whether to enter into a protective mode.

Figure 27:
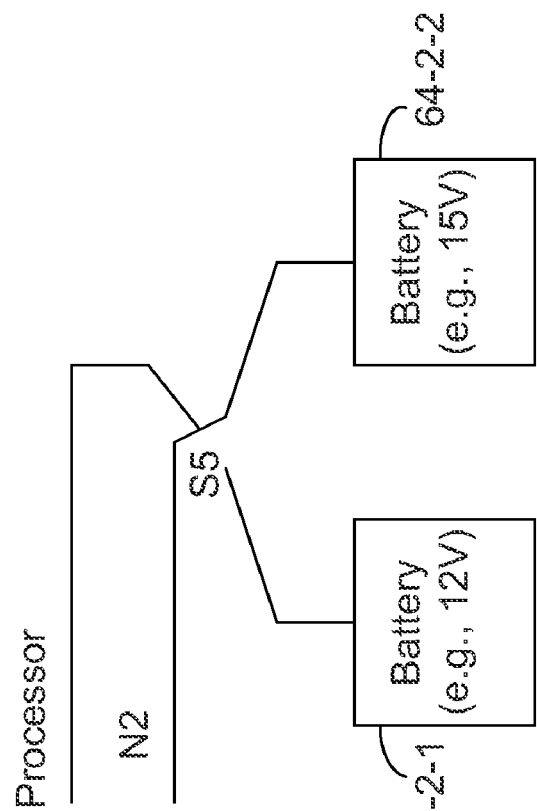
FIG. 27 illustrates two different battery loads connected to an output node by a switch according to some embodiments.

FIG. 27 illustrates two different battery loads, 64-1-1 and 64-1-2, connected to output node N2 by a switch, S5. This configuration illustrates the functional flexibility of power extractor 42 in various embodiments. Given both the source-side and load-side impedance matching characteristics, power extractor 42 automatically adapts to the load and provides power to the load. In other words, the output of power extractor 42 is power—the output voltage and the output current that comprise the power are not fixed. The output voltage and output current automatically adapt to the load, without reducing the power. In other words, power extractor 42 may operate independent of any voltage. Thus, the output power may be unregulated, with the exception of the protection mode.

For example, in some embodiments, power extractor 42 might extract 60 Watts of power from power source 32 to be transferred to battery 186-1. If battery 64-2-1 is a 12 Volt battery, then power extractor 42 might provide 5 A of current at 12 Volts to charge the battery. If battery 64-2-1 is switched to or swapped for a 15 Volt battery 64-2-2, then power extractor 42 will still provide 60 Watts of power to charge the battery in the form of 4 A of current at 15 Volts. While this example illustrates the adaptability/flexibility of power extractor 42, it should be noted that the output voltage from power extractor 42 may need to be slightly higher than the battery voltage in order to cause current to flow into the battery.

In the above example, and in some other embodiments, the power extractor feedback point may be based on output power transfer, rather than traditional systems where the feedback point is based on output voltage or current. Other embodiments operate differently.

Figure 28:
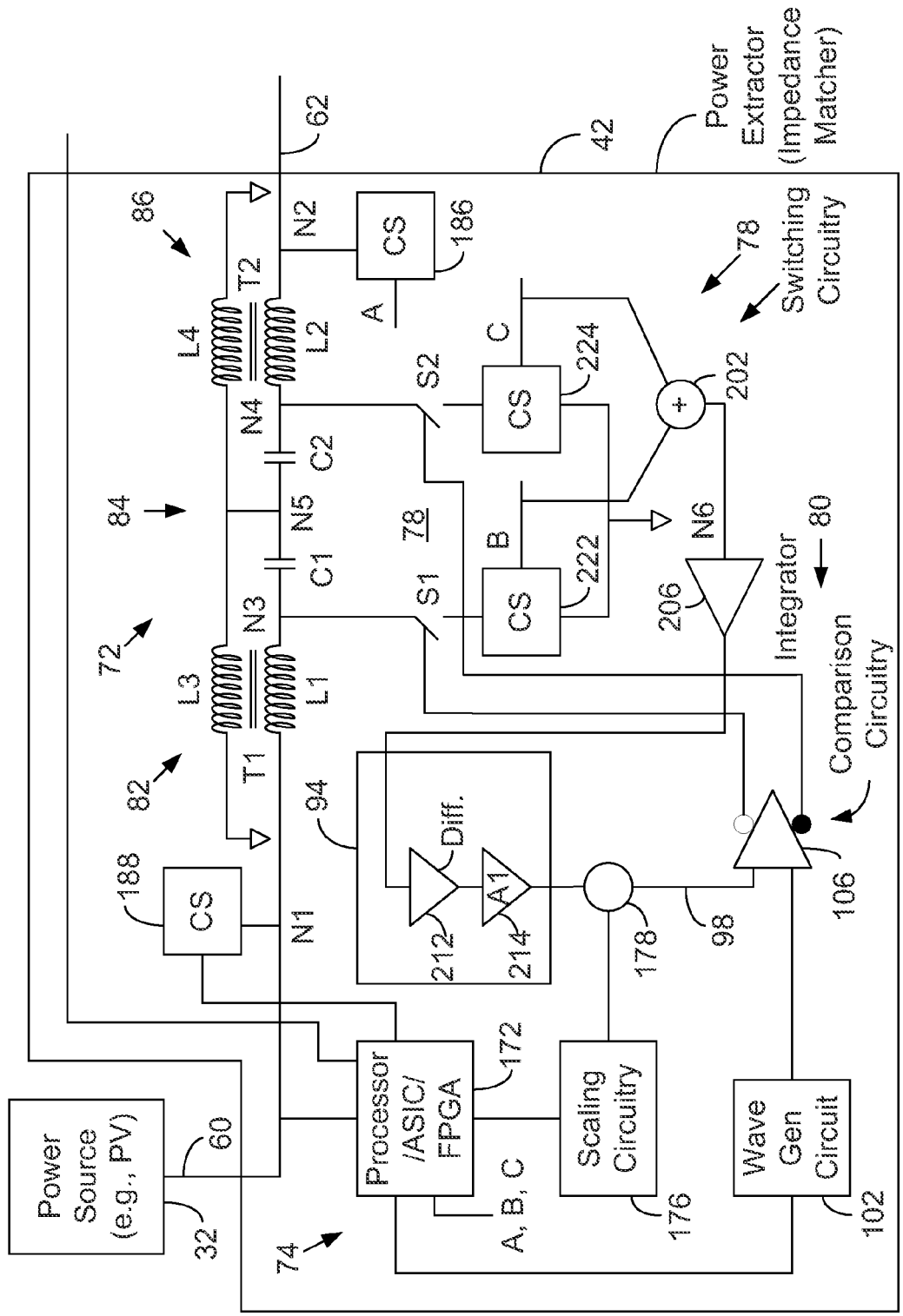
FIGS. 28 and 29 illustrate various details of a power extractor according to some embodiments.

FIG. 28 illustrates further detail of power extractor 42 according to other embodiments. Current sensors 222 and 224 provide signals indicative of the current through switches S1 and S2, which are summed in summer 202. Power may be related to the average current from summer 202. These may be provided to an integrator 206 to provide an signal indicative of the power, which is differentiated by differentiator 212 and amplified by amplifier 214. Voltage change (or voltage slope) may be considered as mentioned above.

Figure 29:
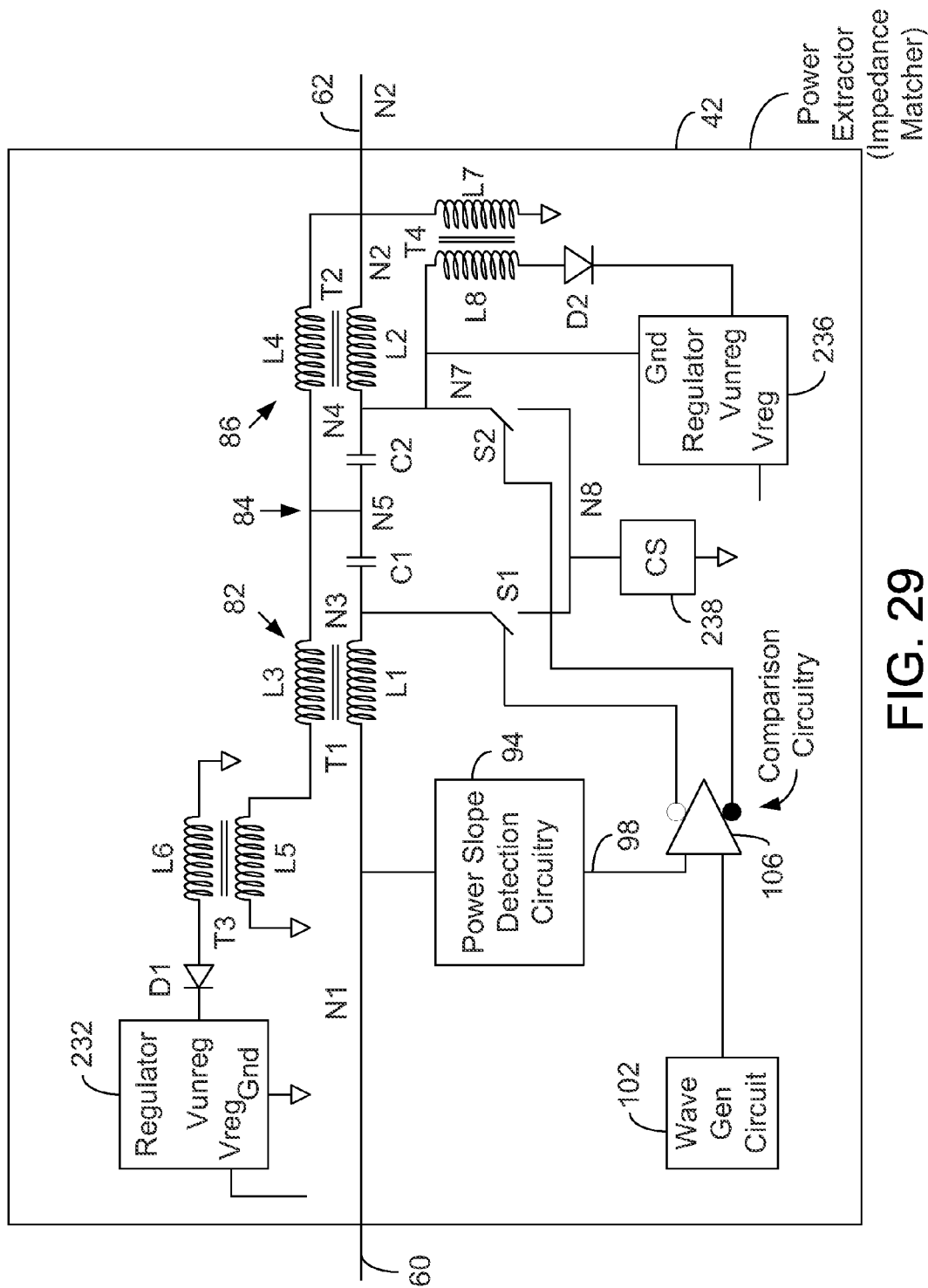

FIG. 29 illustrates voltage regulators 232 and 236 which take unregulated voltage from power extractor 42 and provide a regulated voltage as needed (e.g., to power various circuits within power extractor 42). The unregulated power is provided to regulator 232 through a transformer T2 (inductors L5 and L6) and diode D1. The unregulated power is provided to regulator 236 through a transformer T4 (inductors L7 and L8) and diode D2.

Figure 30:
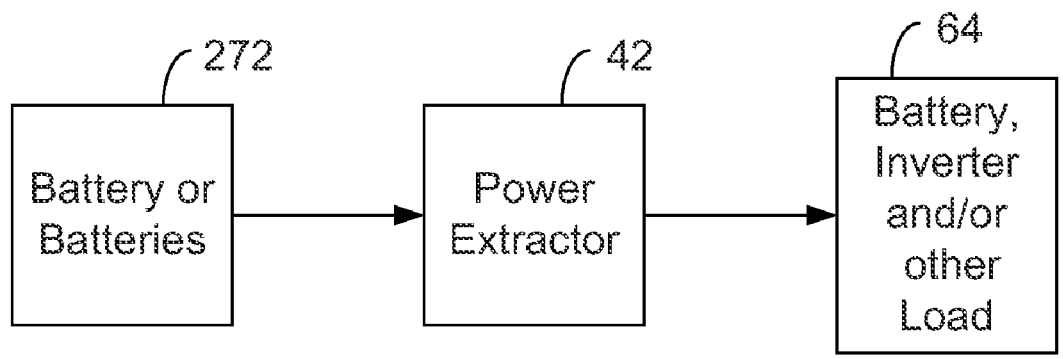
FIG. 30 illustrates a power extractor coupled between one or more batteries and a load according to some embodiments.
Figure 31:
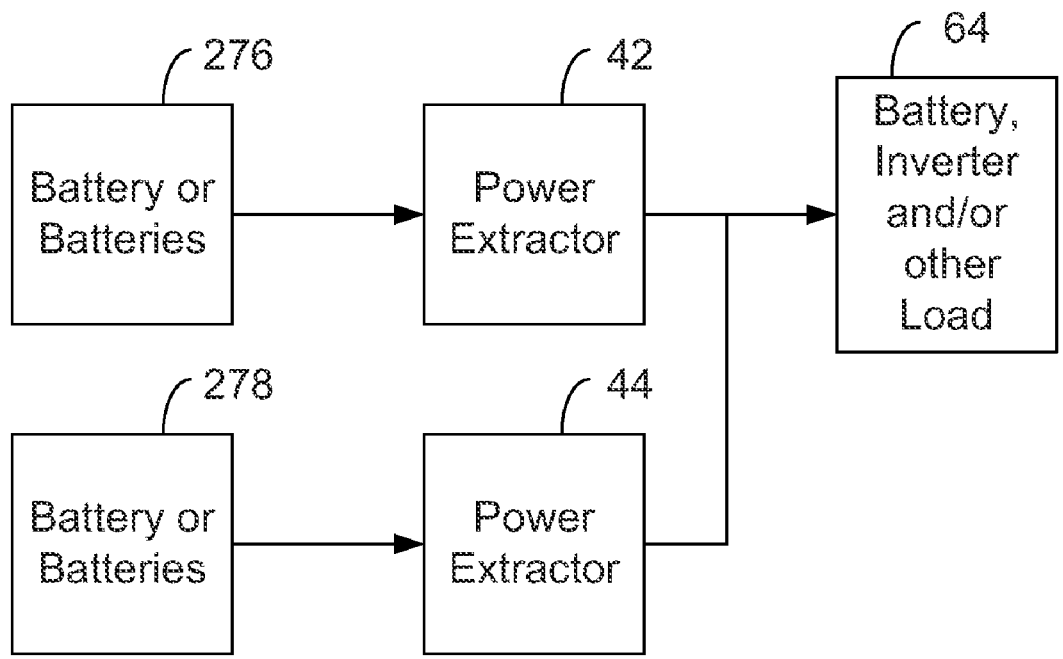
FIG. 31 illustrates a parallel configuration of batteries and power extractors coupled to a load according to some embodiments.

Power extractor 42 may be used in transferring power from one or more batteries 272 to a load 64 which may include another battery. FIG. 30 illustrates a battery or batteries 272 as being the power source. A reason to use power extractor 42 with batteries as the source is that the batteries with lower power and a lower voltage can be used to charge other batteries including with a higher or lower voltage. Given that power extractor 42 extracts DC power in whatever form it is available (e.g., not at specific or fixed voltage or current) and outputs power in whatever form needed by the load (e.g., not at a specific or fixed voltage or current), power extractor 42 is flexible and adaptable—within safety or other reasonable limits, there are no restrictions as to what type of source and/or load can be connected to power extractor 42. For example, power extractor 42 can transfer the available power in a 9 Volt battery to charge a 15 Volt battery. In another example, power extractor 42 can transfer power from two 5 Volt batteries to a 12 Volt battery. The flexibility and adaptability of power extractor 42 is in contrast to traditional charge controllers and other power transfer systems where power transfer from input to output is a byproduct of output voltage regulation. FIG. 31 illustrates parallel power extractors 42 and 44 receiving power from battery power sources 276 and 278, respectively, and providing power to load 64.

Figure 40:
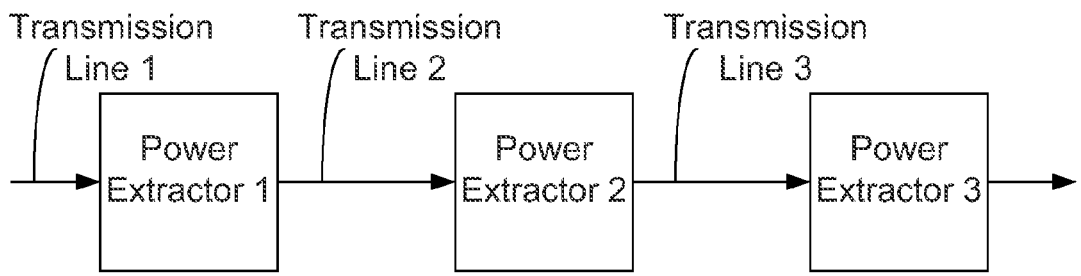
FIG. 40 illustrates power extractors and transmission lines according to some embodiments.

FIG. 32 illustrates a side view of an integrated circuit chip (IC1) including a photovoltaic power source 284 and power extractor 286 fabricated onto a substrate 282 of IC1. Power extractor 286 may be the same as or somewhat different than power extractor 42. FIG. 33 shows a top view of IC1 including photovoltaic power source 284, power extractor 286, first and second nodes and a chip interface 288. There may be a diode between power extractor 286 and source 284. In practice, the layout could be somewhat different with photovoltaic power source 284 taking up more or less service area than is shown. Likewise, power extractor 286 could take up more or less area than is shown. FIG. 34 shows a plurality of IC chips IC1, IC2, . . . IC25 similar to IC1 of FIGS. 32 and 33 joined by a frame 296. The integrated circuit may also contain various function circuitry in addition to the power extractor and the power source. FIG. 32 illustrates that the power extractor can be on a very smaller scale. Conversely, power extractor 42 may be on a very large scale, for example, in high power embodiments. FIG. 40 may be an example of such high power embodiments. For example, parts of the control loop such as power slope detection circuitry 94 may be up to a substantial distance from node N1. In some embodiments, the distance is less than one meter, and in other embodiments, it is more than one meter and it may be substantially more than one meter. Alternatively, the power slope detection circuitry and power transfer circuitry may be close together in the same container or housing. Optical coupling or magnetic coupling may be used in various places including between node N1 and the power change detector.

Figure 35:
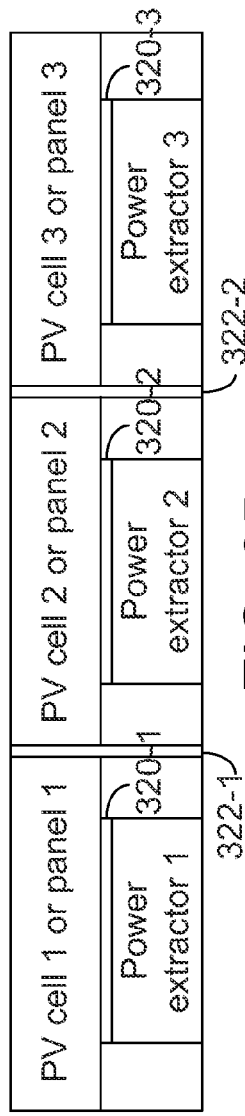
FIGS. 35-37 each illustrate a group of PV cells or panels with corresponding power extractors according to some embodiments.
Figure 36:
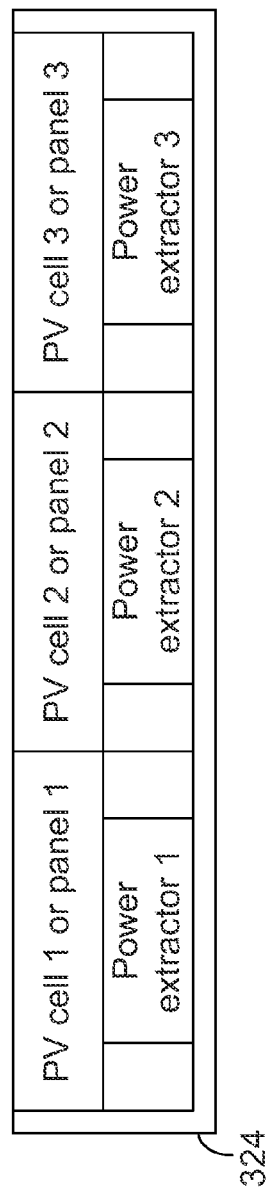
Figure 37:
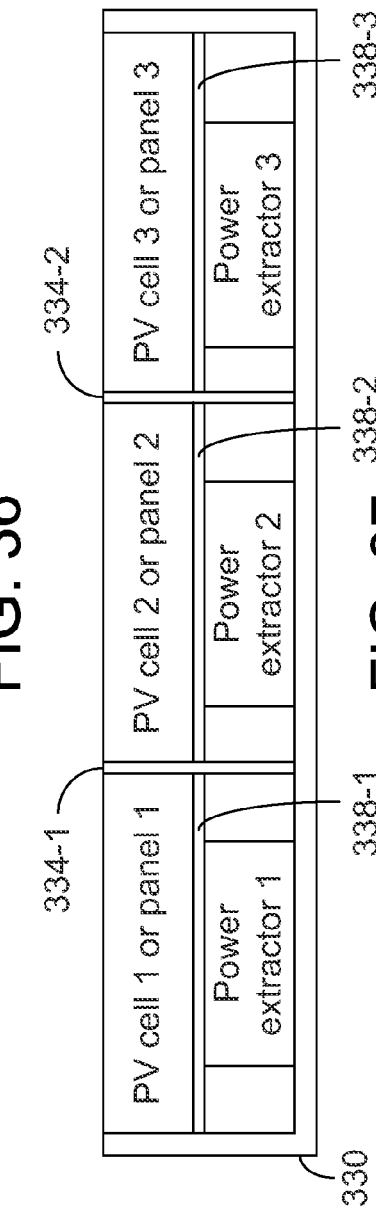

FIGS. 35, 36, and 37 illustrate different configurations for connecting one or more power extractors (power extractors 1, 2, and 3) to one or more photovoltaic (PV) sources according to various embodiments. For example, in FIG. 35, PV power sources (e.g., PV cells or PV panels) are directly connected together and to power extractors 1, 2 and 3, through connectors 320-1, 320-2, and 320-3, and 322-1 and 322-2, which may be glues, adhesives, mounting brackets, and/or other connectors in various embodiments. In FIG. 36, PV sources 1, 2, and 3 and power extractors 1, 2, and 3 are directly connected while the entire unit is supported by an external frame 320. In FIG. 37, PV sources are connected to each other and to power extractors 1, 2, and 3 via frame elements 330, 334-1, 334-2, 338-1, 338-2, and 228-3.

Figure 38:
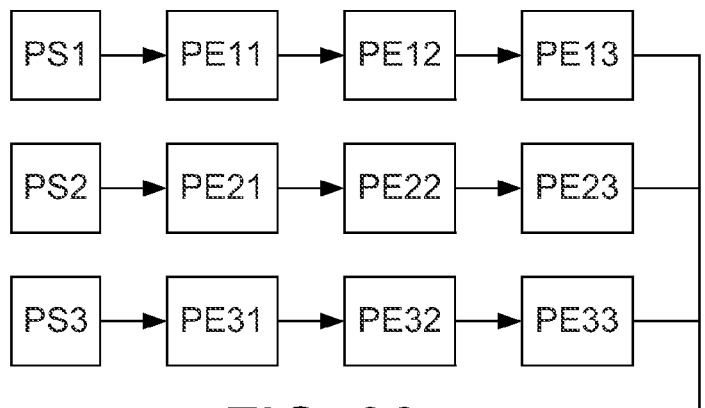
FIG. 38 illustrates parallel groups of serial power extractors with each group coupled to a power source according to some embodiments.
Figure 39:
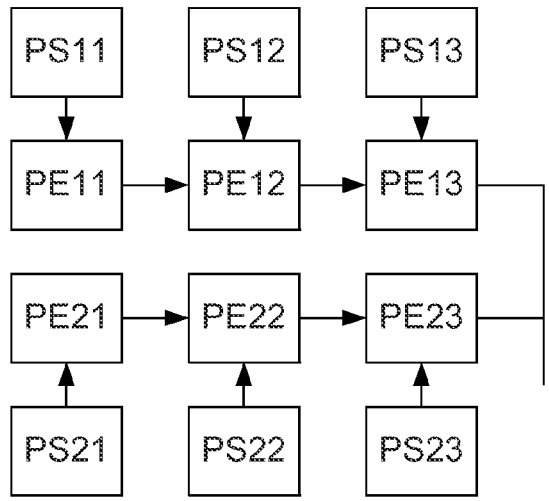
FIG. 39 illustrates parallel groups of power extractors with each power extractor coupled to a power source according to some embodiments.

FIGS. 38 and 39 illustrate various configurations for connecting multiple power sources and multiple power extractors according to various embodiments. For example, FIG. 38 shows power extractors PE11, PE12, and PE13 in series to increase voltage from a power source S1. Parallel power extractors PE21, PE22, and PE23 in series with power source PS2, and PE31, PE32, and PE33 in series power source PS3 are combined to increase current. FIG. 39 is similar, but each power extractor is coupled to a power source (PS11 to PE11, PS12 to PE12, PS13 to PE13, PS21 to PE21, PS22 to PE22, and PS23 to PE23).

FIG. 40 illustrates the placement of power extractors in one or more transmission lines. Of course, the magnitude of the power that may be transferred through power extractors 1, 2, and 3 in FIG. 40 is far greater than may be transferred in the integrated circuit of FIGS. 32-34.

Figure 41:
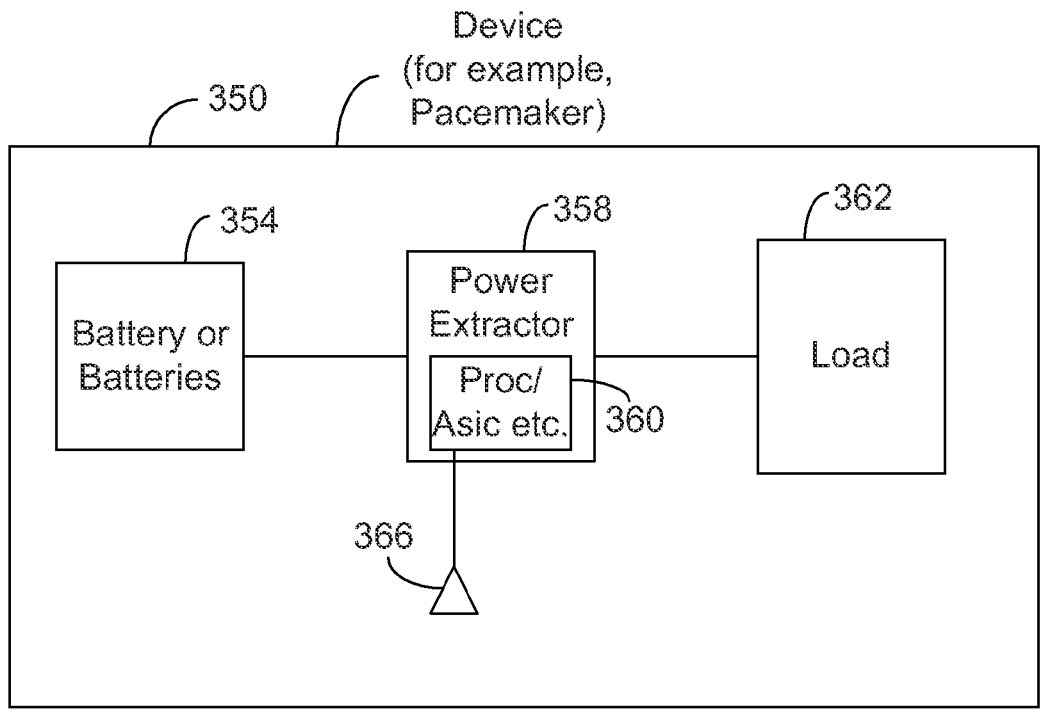
FIGS. 41 and 42 illustrate a power extractor used in a device according to some embodiments.

The power extractor of the invention may be used in connection with many different types of devices. For example, FIG. 41 illustrates the use of a power extractor 358 in a device 350 such as a pacemaker. A pacemaker device is used in this example by way of illustration only; other types of devices may be similarly be used in other embodiments. Power extractor 358 extracts power from battery or batteries 354 for power for a load 312 (e.g., the pacemaker itself). Power extractor 358 includes a processor/ASIC/or other circuitry 360 to determine battery usage and/or battery life in the pacemaker. The information can be communicated through an antenna 366. Based on that information, a doctor or technician or other person can send control information to processor 360 to bias the power extractor such that battery power is conserved, optimized, etc. in device 302 as desired. That is, it is not necessarily desirable to use the battery with the most power, but rather conservation of power may be more desirable. The bias signal of FIG. 25 may be useful for helping with battery conservation.

Figure 42:
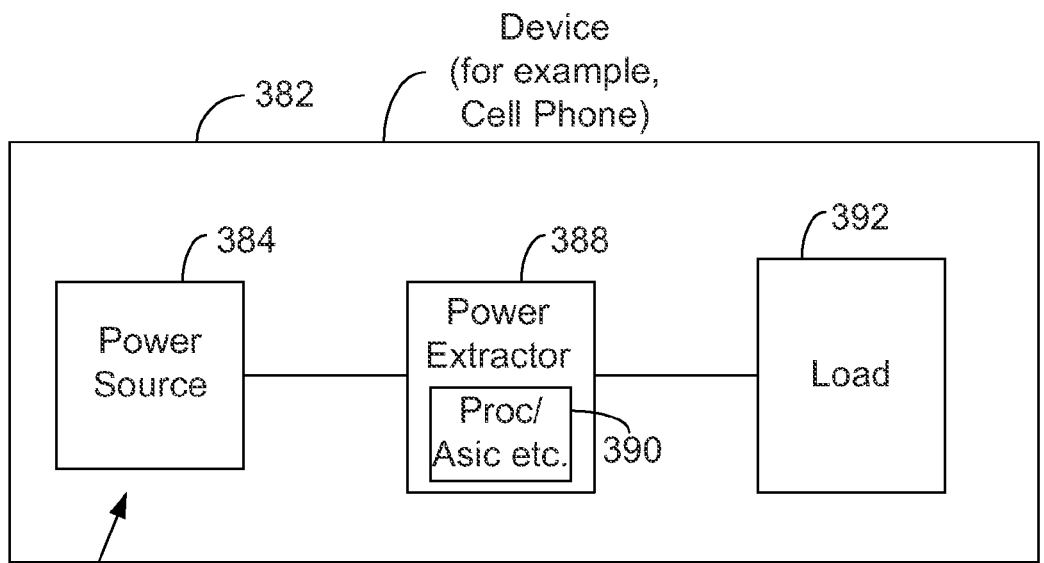

FIG. 42 illustrates the use of a power extractor 388 in another device 382, such as a cell phone. Again, a cell phone is used by way of example and illustration; other devices may incorporate a power extractor in similar fashion. Power extractor 388 is included in device 382 to extract power from a power source 384. Example sources of power can include light (including solar) power, heat (e.g., body heat), energy from motion (e.g., walking, running, general body movement, etc.), wind, battery, converting infrared to electrical energy, etc. Any electrical power that can be generated by power source 384 can be extracted by power extractor 388 and transferred to load 392 to power device 382. Processor 390 may be used control a desirable mode, for example, getting the maximum power out of a solar cell or thermal couple power source, or trying to converse battery power when the battery gets low. The device could have a combination of power sources. Thus, in some embodiments, power extractor 388 can be used to charge, either partially or fully, a cell phone battery without having to plug device 382 into a traditional electrical outlet.

Figure 43:
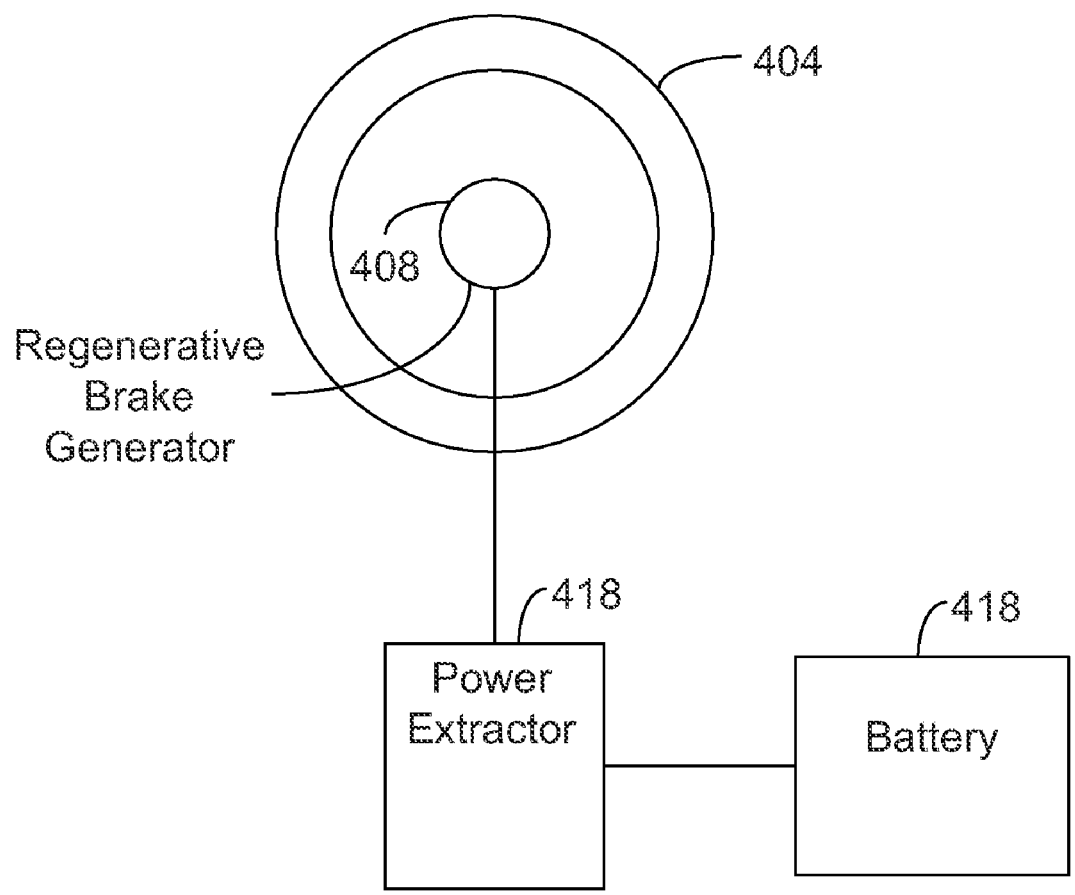
FIG. 43 illustrates a system with a power extractor coupled between a regenerative generator and a battery according to some embodiments.

As another example, FIG. 43 illustrates a vehicle wheel 404 with a regenerative brake generator 408 which provides power to power extractor 418 to charge a battery 418. Power extractor 418 may seek to get the maximum power out of generator 408.

Figure 44:
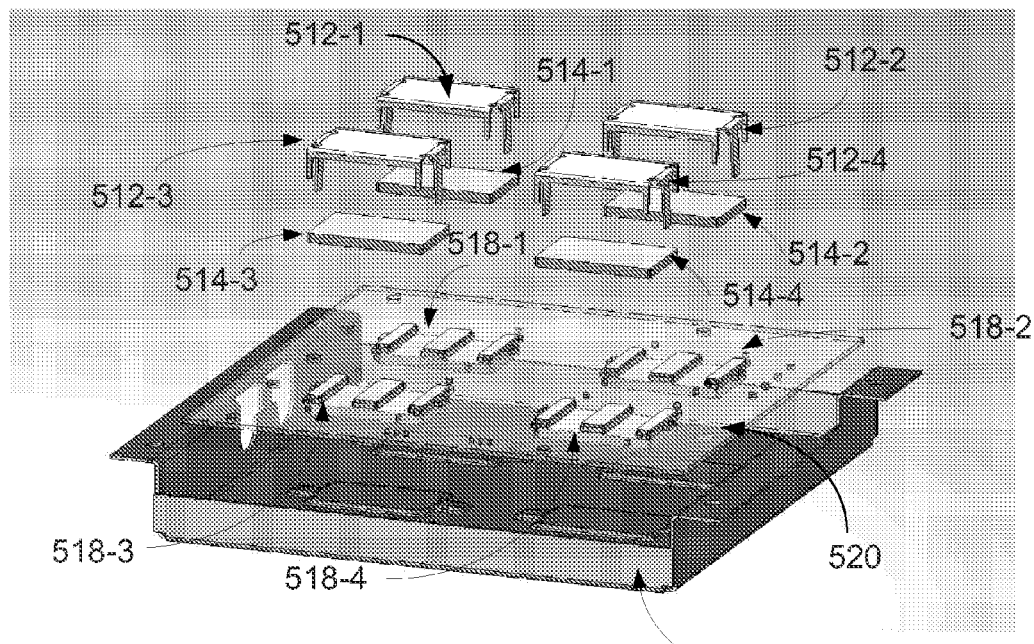
FIG. 44 illustrates a planar inductive device assembly using transformer clips.

FIG. 44 illustrates transformer clips 512-1, 512-2, 512-3, and 512-4 that may be used to provide cooling for planar inductive devices such planar inductance coils or planar transformers including I-cores 514-1, 514-2, 514-3 and 514-4 and E-cores 518-1, 518-2, 518-3, and 518-4 supported by a printed circuit board (PCB) fabrication 520 placed in a chassis 522. Chassis 522 may be attached on a backside of a solar cell, solar panel, or other power source. Clips 512 may be made of aluminum, copper, or some other thermally conductive material. A thermal heat paste or other heat conductor may be used to help with heat conduction. Of course, the system of FIG. 44 is not be used in many embodiments.

Figure 45:
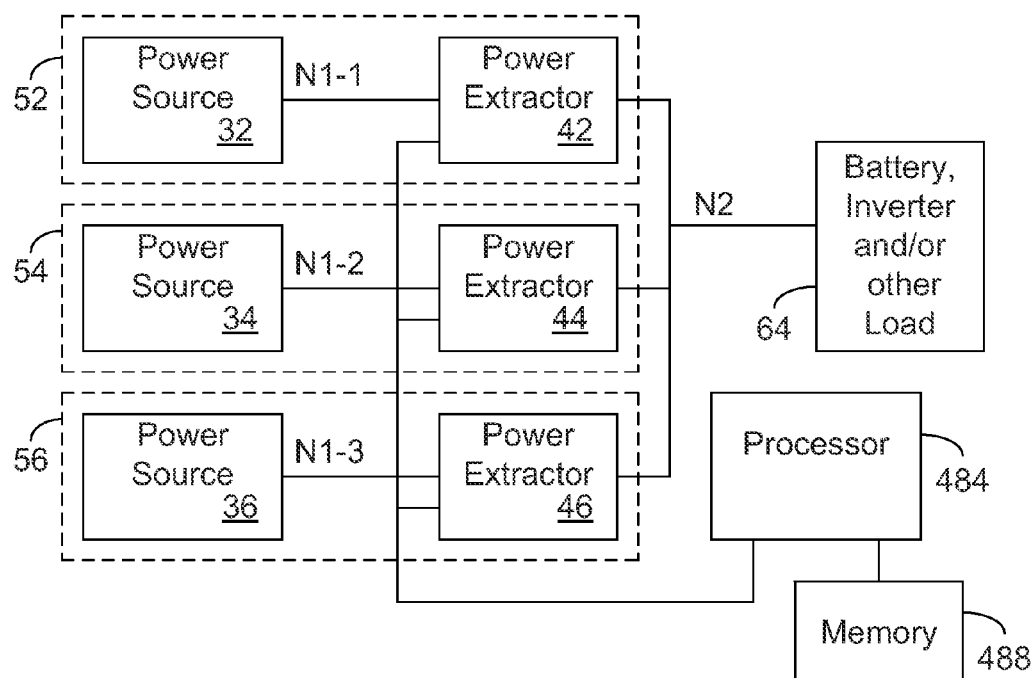
FIG. 45 illustrates a system similar to that of FIG. 2 with a central processor to gather data from or provide signals to the power extractors according to some embodiments.

FIG. 45 is similar to FIG. 2 except that a processor 484 communicates with power extractors 42, 44, and 46. The communication may be in just one or in both directions. Examples of the data or other information communicated are provided in connection with FIG. 46. Memory 488 can hold data for future analysis.

Figure 46:
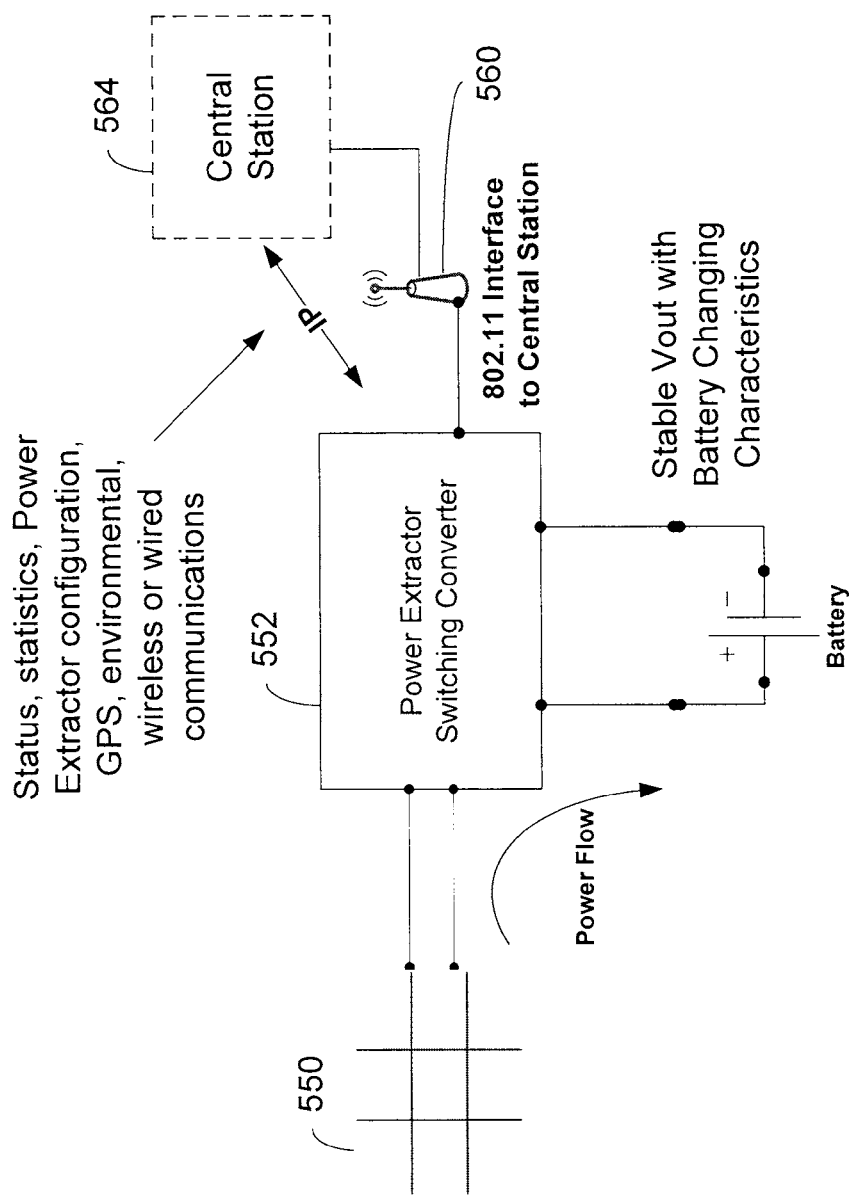
FIG. 46 illustrates a system with a power supply, power extractor, and central station to gather data from the power extractor or supply signals to the power extractor according to some embodiments.

FIG. 46 illustrates a system with a power source 550 to provide power to a power extractor switching converter (PESC) 552 which may be the same as power extractor 42. In addition to controlling PESC functions, a processor (such as a microprocessor or digital signal processor) in PESC 552 may collect statistical information about all stages of the power conversion and communicates real time telemetry, power statistical data, and energy statistical data to a central station and also receives real time data power control algorithms, administrative information, sensor management commands, and new software images from the central station. The gathered information (including one or more of the following: status, statistics, power extractor configuration, GPS (global positioning system) information, and environmental information) is provided by the processor in PESC 552 to a processor in a central station 564 through wired or wireless (560) communication. Processor 484 and memory 488 of FIG. 45 are examples of components of central station 564. A communication subsystem (for example, Ethernet) allows the communication between the processor and the central station 564. The processor in PESC 552 may include input line side DC voltage and current sensors, power stage output voltage and current sensors, output side DC signal sensing and output line side DC sensors.

Various additional components may be used in the above-illustrated components. For example, a fuse and blocking diode may be placed in parallel with a load. If the fuse is blown because the diode is forward biased, it may be used to provide information that there was excessive current or voltage. The information may be of immediate use to place the system in a protective mode or it may be of use for later diagnostic information. A fuse may also be in series between the extractor and the load.

In some embodiments, circuitry such as a thermocouple device may be used to recapture heat from the power extractor and create power from it.

In some embodiments, the power may be delivered in discrete packets.

The background section of this disclosure provides various detailed information which is believed to be correct, but which may inadvertently include some errors. These errors, if they exist, would in no way detract from the inventions described and claimed herein. The Detailed Description section may also include some inadvertent errors which would not detract from the invention. Further, the Detailed Description section includes some theoretical explanations of the operation of the illustrated power extractor. It is believed that these theoretical explanations are correct, but if they are partially incorrect that would not detract from what is an enabling disclosure or detract from the inventions described and claimed.

It will be appreciated that the figures include block diagrams and schematic representations that may be implemented in a variety of ways and that actual implementations may include various additional components and conductors.

As used herein, the term "embodiment" refers to an implementation of some aspect of the inventions. Reference in the specification to "an embodiment," "one embodiment," "some embodiments," or "other embodiments" means that a particular feature, circuitry, or characteristic is included in at least some embodiments, but not necessarily all embodiments. Different references to "some embodiments" do not necessarily refer to the same "some embodiments."

When it is said the element "A" is coupled to element "B," element A may be directly coupled to element B or be indirectly coupled through, for example, element C. When the specification or claims state that a component, feature, circuit, structure, process, or characteristic A is in response to a component, feature, circuit, structure, process, or characteristic B, it merely means that A is at least partially responsive to B (but may also be responsive to C, or B and C at the same time). That is, when it is said A is in response to B, A could be in response to B and C at the same time. Likewise, when it is said that A causes B, A is at least a partial cause of B, but there could be other causes of B either separately or in combination with A.

If the specification states a component, feature, structure, circuitry, or characteristic "may", "might", or "could" be included, that particular component, feature, circuitry, or characteristic is not required to be included. If the specification or claim refers to "a" structure, that does not mean there is only one of the structure.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured with reference to the claims that follow.

What is claimed is:

1. An apparatus comprising:
   a first node;
   a photovoltaic power source coupled to the first node;
   a second node to couple to a load; and
   a power extractor to transfer power from the photovoltaic power source between the first and second nodes, wherein the power extractor, the first node, the power source, and the second node are each part of a single integrated circuit, and
      wherein the power extractor is to be operated such that impedances of the power extractor are dynamically changed both in response to detected power changes at the source and a capacity of the load to receive power generated by the power source,
      an output impedance as seen from the second node to be dynamically changed when the load cannot receive all power generated by the power source, to approach matching a first impedance outside the power extractor as seen from the second node, the first impedance including an impedance of the power extractor and the power source coupled to the first node;
      an input impedance as seen from the first node to be dynamically changed when the load can receive more power than generated by the power source, to approach matching a second impedance outside the power extractor as seen from the first node, the second impedance including an impedance of the power extractor and the load coupled to the second node; and
      both output and input impedances of the power extractor to be dynamically changed when the load can receive all power generated by the power source.

2. The apparatus of claim 1, wherein the power extractor seeks to match an input impedance of the power extractor with an output impedance of the power source.

3. The apparatus of claim 1, wherein the power extractor is operated to seek to transfer a magnitude of power from a power source such that the power source provides a maximum available power given conditions beyond the control of the power extractor.

4. The apparatus of claim 1, further comprising a third node and a fourth node;
   a second photovoltaic power source; and
   a second power extractor to transfer power from the second photovoltaic power source between the third and fourth nodes, wherein the power extractor, the third node, the power source, and the fourth node are each part of a second single integrated circuit, and
   wherein the second and fourth nodes are joined to each other.

5. An apparatus comprising:
   a first node, a second node, a third node, and a fourth node, the second node to couple to a first load and the fourth node to couple to a second load; and
   a first power source coupled to the first node and a second power source coupled to the third node;
   a first power extractor to transfer first power between the first and second nodes including providing a first current to the second node, and wherein the first power extractor includes first power change analysis circuitry to detect first power changes from the first power source, and wherein the first power extractor transfers the first power at magnitudes that are at least partially dependent on the detected first power changes;
      wherein the first power extractor is to be operated such that impedances of the power extractor are dynamically changed both in response to the detected first power changes and a capacity of the first load to receive power generated by the first power source,
      an output impedance as seen from the second node to be dynamically changed when the first load cannot receive all power generated by the first power source, to approach matching a first impedance outside the first power extractor as seen from the second node, the first impedance including an impedance of the first power extractor and the first power source coupled to the first node;
      an input impedance as seen from the first node to be dynamically changed when the first load can receive more power than generated by the first power source, to approach matching a second impedance outside the first power extractor as seen from the first node, the second impedance including an impedance of the first power extractor and the first load coupled to the second node; and both output and input impedances of the first power extractor to be dynamically changed when the first load can receive all power generated by the first power source; and a second power extractor to transfer second power between the third and fourth nodes including providing a second current to the fourth node, and wherein the second power extractor includes second power change analysis circuitry to detect second power changes from the second power source, and wherein the second power extractor transfers the second power at magnitudes that are at least partially dependent on the detected second power changes;

wherein the second power extractor is to be operated to dynamically change impedance of the second power extractor in response to the detected second power changes and a capacity of the second load to receive power generated by the second power source, an output impedance as seen from the fourth node to be dynamically changed when the second load cannot receive all power generated by the second power source, to approach matching a third impedance outside the second power extractor as seen from the fourth node, the third impedance including an impedance of the second power extractor and the second power source coupled to the third node;

an input impedance as seen from the third node to be dynamically changed when the second load can receive more power than generated by the second power source, to approach matching a fourth impedance outside the second power extractor as seen from the third node, the fourth impedance including an impedance of the second power extractor and the second load coupled to the fourth node; and both output and input impedances of the second power extractor to be dynamically changed when the second load can receive all power generated by the second power source; and a frame to hold the first and second power sources and the first and second power extractors.

6. The apparatus of claim 5, wherein the second and fourth nodes are connected to each other, and the first and second loads are the same load.

7. The apparatus of claim 5, wherein the first power source is adjacent to the first power extractor and the second power source is adjacent to the second power extractor.

8. The apparatus of claim 5, further comprising a central station to obtain information from the first and second power extractors.

9. The apparatus of claim 8, wherein the central station is also to provide information to the first and second power extractors.

10. A system comprising:

a first direct current (DC) power source and a second DC power source;

a first node, a second node, and a third node, wherein the second node is to couple to a load;

a first power extractor coupled to the first power source through the first node to transfer DC power from the first power source through the first node to the second node;

wherein the first power extractor is to be operated such that impedances of the power extractor are dynamically changed both in response to detected first power changes and a capacity of the load to receive power generated by the first power source, an output impedance as seen from the second node to be dynamically changed when the load cannot receive all power generated by the first power source, to approach matching a first impedance outside the first power extractor as seen from the second node, the first impedance including an impedance of the first power extractor and the first power source coupled to the first node;

an input impedance as seen from the first node to be dynamically changed when the load can receive more power than generated by the first power source, to approach matching a second impedance outside the first power extractor as seen from the first node, the second impedance including an impedance of the first power extractor and the load coupled to the second node; and both output and input impedances of the first power extractor to be dynamically changed when the load can receive all power generated by the first power source; and a second power extractor coupled to the second power source through the third node to transfer DC power from the second power source through the third node to the second node, wherein a first current from the first power extractor is combined with a second current from the second power extractor at the second node; and wherein the second power extractor is to be operated to dynamically change impedance of the second power extractor in response to detected second power changes and a capacity of the load to receive power generated by the second power source, an output impedance as seen from the second node to be dynamically changed when the load cannot receive all power generated by the second power source, to approach matching a third impedance outside the second power extractor as seen from the second node, the third impedance including an impedance of the second power extractor and the second power source coupled to the third node;

an input impedance as seen from the third node to be dynamically changed when the load can receive more power than generated by the second power source, to approach matching a fourth impedance outside the second power extractor as seen from the third node, the fourth impedance including an impedance of the second power extractor and the load coupled to the second node; and both output and input impedances of the second power extractor to be dynamically changed when the load can receive all power generated by the second power source.

11. The system of claim 10, further comprising a frame to which the first and second power sources are rigidly coupled.

12. The system of claim 10, further comprising a frame to which the first and second power sources and the first and second power extractors are rigidly coupled.

13. The system of claim 10, wherein the first power extractor is positioned adjacent to the first power source, and the second power extractor is positioned adjacent to the second power source.

14. The system of claim 10, wherein an amount of power provided by the first power extractor depends at least in part on characteristics of the first power source, and an amount of power provided by the second power extractor depends at least in part on characteristics of the second power source.

15. The system of claim 10, in which the first and second power extractors selectively transfer power from the first and second power sources, and at times the first and second power extractors do not transfer power from the first and second power sources.

16. The system of claim 10, further comprising additional power extractors to provide current to the second node from additional power sources.

17. The system of claim 10, wherein the power source includes at least one of the following: photovoltaic, wind power, a hydrogen power generator, a battery, piezo-electric, hydro-electric, thermocouple power sources and other stable variable power sources, and other unstable power sources.

18. The system of claim 10, further comprising a central station to obtain information from the first and second power extractors.

19. The system of claim 18, wherein the central station is also to provide information to the first and second power extractors.

20. A system comprising:
   a node;
   a group of direct current (DC) power sources arranged in a frame; and
   a group of power extractors to each provide DC electrical power from only one of the power sources to the node, each power extractor to separately monitor a maximum power point of only the one of the power sources and impedance match to the node.
      wherein each power extractor is to be operated such that impedances of the power extractor are dynamically changed both in response to detected power changes and a capacity of a load coupled to the node to receive power generated by a respective power source,
      an output impedance as seen from the node to be dynamically changed when the load cannot receive all power generated by the power source, to approach matching a first impedance outside the power extractor as seen from the node, the first impedance including an impedance of the power extractor and the respective power source coupled to the power extractor;
      an input impedance as seen from the respective power source to be dynamically changed when the load can receive more power than generated by the respective power source, to approach matching a second impedance outside the power extractor as seen from the respective power source, the second impedance including an impedance of the power extractor and the load coupled to the node; and
      both output and input impedances of the power extractor to be dynamically changed when the load can receive all power generated by the respective power source.

21. The system of claim 20, wherein the power extractors are each positioned adjacent to one of the power sources.

22. The system of claim 20, wherein the power sources are photovoltaic power sources.

23. The system of claim 22, wherein the photovoltaic power sources are panels each including multiple photovoltaic cells.

24. The system of claim 22, wherein the photovoltaic power sources are each a single photovoltaic cell.

25. The system of claim 20, further comprising additional power sources arranged in the frame, and additional power extractors electrically coupled between ones of the additional power sources, respectively, and the node, wherein the additional power extractors are each positioned adjacent to one of the additional power sources.

26. The system of claim 20, wherein the power extractors and corresponding ones of the power sources are separated by a portion of the frame.

27. The system of claim 20, wherein the power extractors and corresponding power sources are joined together.

28. The system of claim 20, wherein the power extractors and corresponding power sources are joined together through an adhesive material.

29. The system of claim 20, further comprising a central station to obtain information from the first and second power extractors.

30. The system of claim 29, wherein the central station is also to provide information to the first and second power extractors.

31. A system including:
   first, second, and third nodes;
   a direct current (DC) power source to provide DC power to the first node;
   a first power extractor to transfer DC power from the first node to the second node; and
   a second power extractor to transfer DC power from the second node to the third node and increase the voltage of the DC power at the second node;
      wherein the second power extractor is to be operated such that impedances of the second power extractor are dynamically changed both in response to detected power changes and a capacity of a load coupled to third node to receive power generated by the DC power source,
      an output impedance as seen from the third node to be dynamically changed when the load cannot receive all power generated by the DC power source, to approach matching a first impedance outside the second power extractor as seen from the third node, the first impedance including an impedance of the first and second power extractors and the DC power source;
      an input impedance as seen from the second node to be dynamically changed when the load can receive more power than generated by the DC power source, to approach matching a second impedance outside the second power extractor as seen from the second node, the second impedance including an impedance of the second power extractor and the load coupled to the third node; and
      both output and input impedances of the second power extractor to be dynamically changed when the load can receive all power generated by the DC power source.

32. The system of claim 31, wherein the power source is a photovoltaic cell.

33. The system of claim 31, further comprising a transmission line between the second and third nodes.

34. The system of claim 31, further comprising:
   fourth and fifth nodes;
   a second power source to provide power to the fourth node;
   a third power extractor to transfer power from the fourth node to the fifth node; and
   a fourth power extractor to transfer power from the fifth node to the third node and increase the voltage of the power at the fifth node;
      wherein the fourth power extractor is to be operated to dynamically change impedance of the fourth power extractor in response to detected power changes and a capacity of the load coupled to the third node to receive power generated by the second power source, an output impedance as seen from the third node to be dynamically changed when the load cannot receive all power generated by the second power source, to approach matching a third impedance outside the fourth power extractor as seen from the third node, the second impedance including an impedance of the third and fourth power extractors and the second power source;

an input impedance as seen from the fourth node to be dynamically changed when the load can receive more power than generated by the second power source, to approach matching a fourth impedance outside the fourth power extractor as seen from the fourth node, the fourth impedance including an impedance of the fourth power extractor and the load coupled to the third node; and both output and input impedances of the fourth power extractor to be dynamically changed when the load can receive all power generated by the second power source.

35. The system of claim 31, wherein the first and second power extractors provide impedance matching.

36. The system of claim 31, further comprising a central station to obtain information from the first and second power extractors.

* * * * *